US012200979B2

(12) United States Patent
Park et al.

(10) Patent No.: US 12,200,979 B2
(45) Date of Patent: Jan. 14, 2025

(54) DISPLAY PANEL AND DISPLAY APPARATUS INCLUDING THE SAME

(71) Applicant: Samsung Display Co., Ltd., Yongin-si (KR)

(72) Inventors: Gwuihyun Park, Yongin-si (KR); Donghwan Shim, Yongin-si (KR); Saehee Han, Yongin-si (KR); Sungjin Hong, Yongin-si (KR); Hyungkeun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 648 days.

(21) Appl. No.: 17/443,593

(22) Filed: Jul. 27, 2021

(65) Prior Publication Data
US 2022/0149129 A1  May 12, 2022

(30) Foreign Application Priority Data

Nov. 9, 2020  (KR) .................. 10-2020-0148611

(51) Int. Cl.
*H10K 59/124*  (2023.01)
*H10K 59/121*  (2023.01)
*H10K 59/131*  (2023.01)

(52) U.S. Cl.
CPC ....... *H10K 59/124* (2023.02); *H10K 59/1213* (2023.02); *H10K 59/131* (2023.02)

(58) Field of Classification Search
CPC ............ H10K 59/124; H10K 59/1213; H10K 59/131; H10K 59/65; H10K 59/80515; H10K 59/121; H10K 59/126; G09G 3/3233

See application file for complete search history.

(56) References Cited

U.S. PATENT DOCUMENTS

| 8,896,800 B2 | 11/2014 | Park et al. |
| 2005/0007494 A1 | 1/2005 | Yamazaki et al. |
| 2005/0116232 A1 | 6/2005 | Kim et al. |
| 2016/0181333 A1 | 6/2016 | Park et al. |
| 2017/0338292 A1 | 11/2017 | Choi et al. |
| 2020/0075698 A1 | 3/2020 | Yang et al. |
| 2020/0105843 A1 | 4/2020 | Baek et al. |

(Continued)

FOREIGN PATENT DOCUMENTS

| JP | 2000-299469 A | 10/2000 |
| KR | 10-2005-0052026 A | 6/2005 |

(Continued)

*Primary Examiner* — Kevin Quarterman
(74) *Attorney, Agent, or Firm* — Lewis Roca Rothgerber Christie LLP

(57) ABSTRACT

A display panel includes: a first area, a second area, and a third area, a resolution of the second area being less than a resolution of the first area; a substrate; a first pixel electrode at the first area on the substrate; a first pixel circuit at the first area on the substrate, the first pixel circuit being connected to the first pixel electrode; a second pixel electrode at the second area on the substrate; a second pixel circuit at the third area on the substrate, the second pixel circuit being connected to the second pixel electrode; and an opaque layer at the second area between the substrate and the second pixel electrode, the opaque layer including an insulating pattern overlapping with the second pixel electrode.

16 Claims, 37 Drawing Sheets

(56) References Cited

U.S. PATENT DOCUMENTS

2020/0176657 A1   6/2020  Jang et al.
2020/0273927 A1   8/2020  Oh et al.
2020/0303478 A1   9/2020  Lee et al.
2021/0202900 A1   7/2021  Lee
2022/0320222 A1* 10/2022  Hai .................... G06V 40/1318

FOREIGN PATENT DOCUMENTS

| KR | 10-2016-0076034 A | 6/2016 |
| KR | 10-2017-0130019 A | 11/2017 |
| KR | 10-1998096 B1 | 7/2019 |
| KR | 10-2020-0027600 A | 3/2020 |
| KR | 10-2020-0036137 A | 4/2020 |
| KR | 10-2020-0065161 A | 6/2020 |
| KR | 10-2020-0102580 A | 9/2020 |
| KR | 10-2020-0111889 A | 10/2020 |
| KR | 10-2021-0086888 A | 7/2021 |

* cited by examiner

DISPLAY PANEL AND DISPLAY APPARATUS INCLUDING THE SAME

CROSS-REFERENCE TO RELATED APPLICATION

This application claims priority to and the benefit of Korean Patent Application No. 10-2020-0148611, filed on Nov. 9, 2020, in the Korean Intellectual Property Office, the entire disclosure of which is incorporated by reference herein.

BACKGROUND

1. Field

Aspects of one or more embodiments of the present disclosure relate to a display panel, and a display apparatus including the display panel. More particularly, aspects of one or more embodiments of the present disclosure relate to a display panel having an expanded display area so as to display images at a region where a component, such as an electronic element, is provided, and a display apparatus including the display panel.

2. Description of Related Art

Display apparatuses have been used for various purposes. In addition, because the thickness and weight of the display apparatuses have been reduced, a range of utilization of the display apparatuses has increased.

According to the use of the display apparatuses, different methods of designing the shapes thereof have been developed, and more functions have been embedded in, or linked to, the display apparatuses.

The above information disclosed in this Background section is for enhancement of understanding of the background of the present disclosure, and therefore, it may contain information that does not constitute prior art.

SUMMARY

One or more embodiments of the present disclosure are directed to a display panel having an expanded display area so as to display images at a region where a component, for example, such as an electronic element, is provided, and a display apparatus including the display panel.

However, the present disclosure is not limited to the above aspects and features, and additional aspects and features will be set forth, in part, in the description which follows, and in part, will be apparent from the description, or may be learned by practicing one or more of the presented embodiments of the present disclosure.

According to one or more embodiments of the present disclosure, a display panel includes: a first area, a second area, and a third area, a resolution of the second area being less than a resolution of the first area; a substrate; a first pixel electrode at the first area on the substrate; a first pixel circuit at the first area on the substrate, the first pixel circuit being connected to the first pixel electrode; a second pixel electrode at the second area on the substrate; a second pixel circuit at the third area on the substrate, the second pixel circuit being connected to the second pixel electrode; and an opaque layer at the second area between the substrate and the second pixel electrode, the opaque layer including an insulating pattern overlapping with the second pixel electrode.

In an embodiment, the display panel may further include: a first organic insulating layer between the substrate and the second pixel electrode at the second area; and a second organic insulating layer on the first organic insulating layer.

In an embodiment, the opaque layer may be between the second organic insulating layer and the second pixel electrode.

In an embodiment, an upper surface of the opaque layer may contact the second pixel electrode, and a lower surface of the opaque layer may contact the second organic insulating layer.

In an embodiment, the second organic insulating layer may include a recess corresponding to the second pixel electrode, and the opaque layer may be in the recess of the second organic insulating layer.

In an embodiment, the opaque layer may be between the first organic insulating layer and the second organic insulating layer.

In an embodiment, the first organic insulating layer may include a recess corresponding to the second pixel electrode, and the opaque layer may be in the recess of the first organic insulating layer.

In an embodiment, a hole at a location corresponding to the second pixel electrode may penetrate through the first organic insulating layer, and the opaque layer may be in the hole of the first organic insulating layer.

In an embodiment, the display panel may further include a first connecting line between the first organic insulating layer and the second organic insulating layer at the second area, the first connecting line connecting the second pixel electrode to the second pixel circuit.

In an embodiment, the display panel may further include a second connecting line at the third area, the second connecting line connecting the first connecting line to the second pixel circuit.

In an embodiment, the display panel may further include a first connecting line between the substrate and the first organic insulating layer at the second area, the first connecting line connecting the second pixel electrode to the second pixel circuit.

In an embodiment, the display panel may further include a second connecting line at the third area, the second connecting line connecting the first connecting line to the second pixel circuit.

In an embodiment, the display panel may further include: a first organic insulating layer covering the first pixel circuit at the first area and the second pixel circuit at the third area, the first organic insulating layer including a hole corresponding to the second area; and a second organic insulating layer on the first organic insulating layer at the first area and the third area, the second organic insulating layer filling the hole of the first organic insulating layer at the second area between the substrate and the second pixel electrode.

In an embodiment, the opaque layer may be between the substrate and the second organic insulating layer at the second area.

In an embodiment, the display panel may further include a first connecting line between the substrate and the second organic insulating layer at the second area, the first connecting line connecting the second pixel electrode to the second pixel circuit, and the opaque layer may at least partially cover the first connecting line.

In an embodiment, the display panel may further include a second connecting line at the third area, the second connecting line connecting the first connecting line to the second pixel circuit.

According to one or more embodiments of the present disclosure, a display apparatus includes: a display panel including: a first area, a second area, and a third area; a substrate; a first display element at the first area; a second display element at the second area, the second display element including a second pixel electrode on the substrate at the second area; a second pixel circuit at the third area on the substrate, the second pixel circuit being connected to the second pixel electrode; an organic insulating layer between the substrate and the second pixel electrode at the second area; and an opaque layer between the substrate and the second pixel electrode at the second area, the opaque layer including an insulating pattern overlapping with the second pixel electrode; and a component under the display panel, the component corresponding to the second area.

In an embodiment, the organic insulating layer may include: a first organic insulating layer between the substrate and the second pixel electrode; and a second organic insulating layer on the first organic insulating layer.

In an embodiment, the opaque layer may be between the second organic insulating layer and the second pixel electrode.

In an embodiment, the second organic insulating layer may include a recess corresponding to the second pixel electrode, and the opaque layer may be in the recess of the second organic insulating layer.

In an embodiment, the opaque layer may be between the first organic insulating layer and the second organic insulating layer.

In an embodiment, the first organic insulating layer may include a recess corresponding to the second pixel electrode, and the opaque layer may be in the recess of the first organic insulating layer.

In an embodiment, the first organic insulating layer may include a hole penetrating through the first organic insulating layer and corresponding to a location of the second pixel electrode, and the opaque layer may be in the hole of the first organic insulating layer.

In an embodiment, the organic insulating layer may include: a first organic insulating layer covering the second pixel circuit at the third area, the first organic insulating layer including a hole corresponding to the second area; and a second organic insulating layer on the first organic insulating layer at the third area, the second organic insulating layer filling the hole of the first organic insulating layer at the second area between the substrate and the second pixel electrode. The opaque layer may be between the substrate and the second organic insulating layer.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
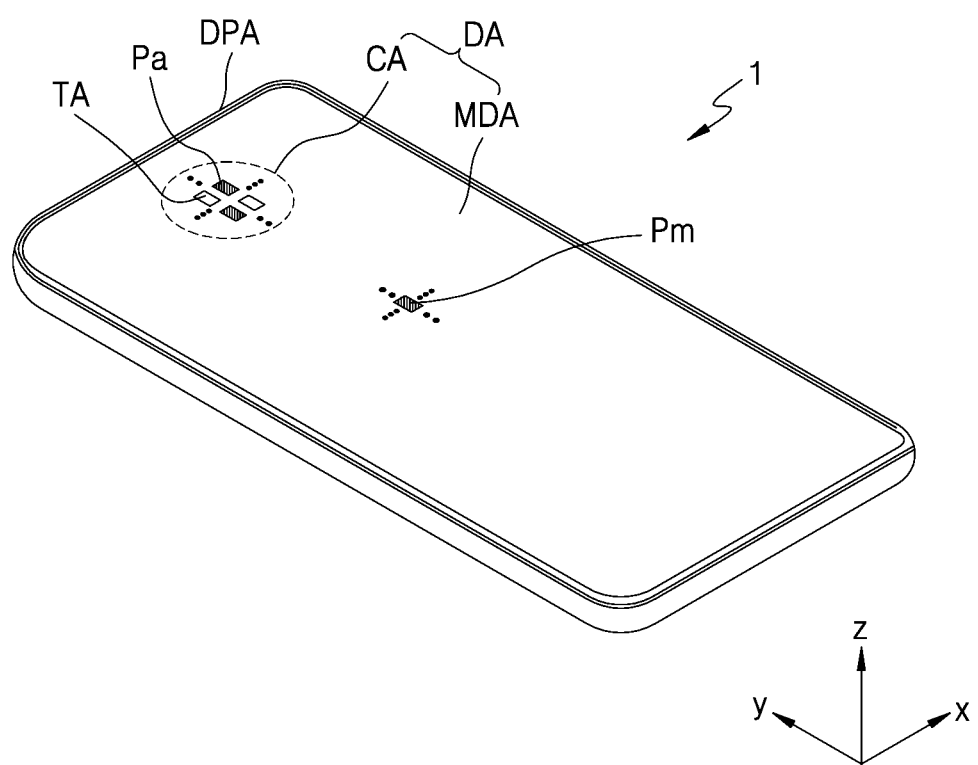
FIG. 1 is a perspective view of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

As used in the present specification, when a line is described as "extending in a first direction or a second direction," this denotes that the line extends in the first direction or the second direction in a zig-zag shape or in a curved shape, as well as the line extending straightly in the first direction or the second direction.

Throughout the specification, the phrase "in a plan view" denotes a view of a target portion from the top, and the phrase "in a cross-sectional view" denotes a view of a cross-section of the target portion that is vertically cut from a lateral direction. Throughout the specification, when a first element is described as "overlapping with" or "overlaps with" a second element, this denotes that the first element is located on or under the second element.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display apparatus 1 according to an embodiment.

Referring to FIG. 1, the display apparatus 1 may include a display area DA, and a peripheral area DPA at (e.g., in or on) an outer portion of the display area DA. For example, the periphery area DPA may at least partially surround (e.g., around a periphery of) the display area DA. The display area DA may include a component area (e.g., a second area) CA, and a main display area (e.g., a first area) MDA at least partially surrounding (e.g., around a periphery of) the component area CA. In other words, the component area CA and the main display area MDA may separately display an image, or may display an image together. The peripheral area (e.g., a third area) DPA may be a non-display area at (e.g., in or on) which pixels are not arranged. In some embodiments, the display area DA may be entirely surrounded (e.g., around a periphery thereof) by the peripheral area DPA.

The display apparatus 1 according to an embodiment may be folded or curved. The display apparatus 1 may be provided in various suitable shapes, for example, such as a rectangular plate shape having two pairs of sides, each pair having sides that are parallel to or substantially parallel to each other. When the display apparatus 1 is provided in a rectangular plate shape, one of two pairs of sides may be longer than the other pair of sides. For convenience of illustration and description, a direction in which a short side extends is represented as an x-direction, a direction in which a long side extends is represented as a y-direction, and a direction perpendicular to or substantially perpendicular to the extending directions of the long and short sides is represented as a z-direction (e.g., a thickness direction).

The display apparatus 1 according to embodiments of the present disclosure is not limited to the above example, and may have various suitable shapes. For example, the display apparatus 1 may be provided in a polygonal shape of a closed type including straight sides, a circular shape or an elliptical shape including a curved side, a semi-circular shape or a semi-elliptical shape including straight and curved sides, and/or the like. When the display apparatus 1 has straight sides, at least some of the corners in each of the shapes thereof may be curved.

In FIG. 1, one component area CA is shown at (e.g., in or on) the main display area MDA. In another embodiment, the display apparatus 1 may include two or more component areas CA, and the shapes and/or sizes of the plurality of component areas CA may be different from one another. When viewed from a direction that is perpendicular to or substantially perpendicular to an upper surface of the display apparatus 1 (e.g., in a plan view), the component area CA may have various suitable shapes, for example, such as a polygonal shape (e.g., a square shape, a star shape, a diamond shape, and/or the like), a circular shape, an elliptical shape, and/or the like. In addition, in FIG. 1, the component area CA is shown to be located at (e.g., in or on) an upper (e.g., in a +y direction) central area of the main display area MDA that has a rectangular shape when viewed from the direction perpendicular to or substantially perpendicular to the upper surface of the display apparatus 1 (e.g., in a plan view), but the present disclosure is not limited thereto, and the component area CA may be at a side, for example, such as an upper right side or an upper left side, of the main display area MDA having the rectangular shape.

The display apparatus 1 may provide images by using a plurality of first sub-pixels (e.g., main sub-pixels) Pm at (e.g., in or on) the main display area MDA, and a plurality of second sub-pixels (e.g., auxiliary sub-pixels) Pa at (e.g., in or on) the component area CA.

As described in more detail below with reference to FIG. 2A and FIG. 2B, a component 40, for example, such as an electronic element, may be located under (e.g., underneath) a display panel to correspond to the component area CA. For example, the component 40 may include a camera (e.g., an imaging device) that uses an infrared ray or a visible ray. As some other examples, the component 40 may include a solar battery, a flash, an illuminance sensor, a proximity sensor, or an iris sensor. As another example, the component 40 may have a function of receiving sound. In order to reduce limitations and restrictions in the functions of the component 40, the component area CA may include a transmission area TA through which light and/or sound output from the component 40 to the outside or proceeding from the outside toward the component 40 may pass. In the display panel or the display apparatus 1 including the display panel according to an embodiment, when light passes through the component area CA, a light transmittance thereof may be about 10% or greater, for example, such as 40% or greater, 25% or greater, 50% or greater, 85% or greater, or 90% or greater.

The plurality of second sub-pixels Pa may be at (e.g., in or on) the component area CA. The plurality of second sub-pixels Pa emit light to provide a desired image (e.g., a predetermined or certain image). An image displayed at (e.g., in or on) the component area CA may be referred to as an auxiliary image, and may have a resolution that is less than that of an image displayed at (e.g., in or on) the main display area MDA. In other words, the component area CA may include the transmission area TA through which light and/or sound may be transmitted, and when there is no sub-pixel at (e.g., in or on) the transmission area TA, the number of second sub-pixels Pa per unit area at (e.g., in or on) the component area CA may be less than the number of first sub-pixels Pm per unit area at (e.g., in or on) the main display area MDA.

Figure 2A:
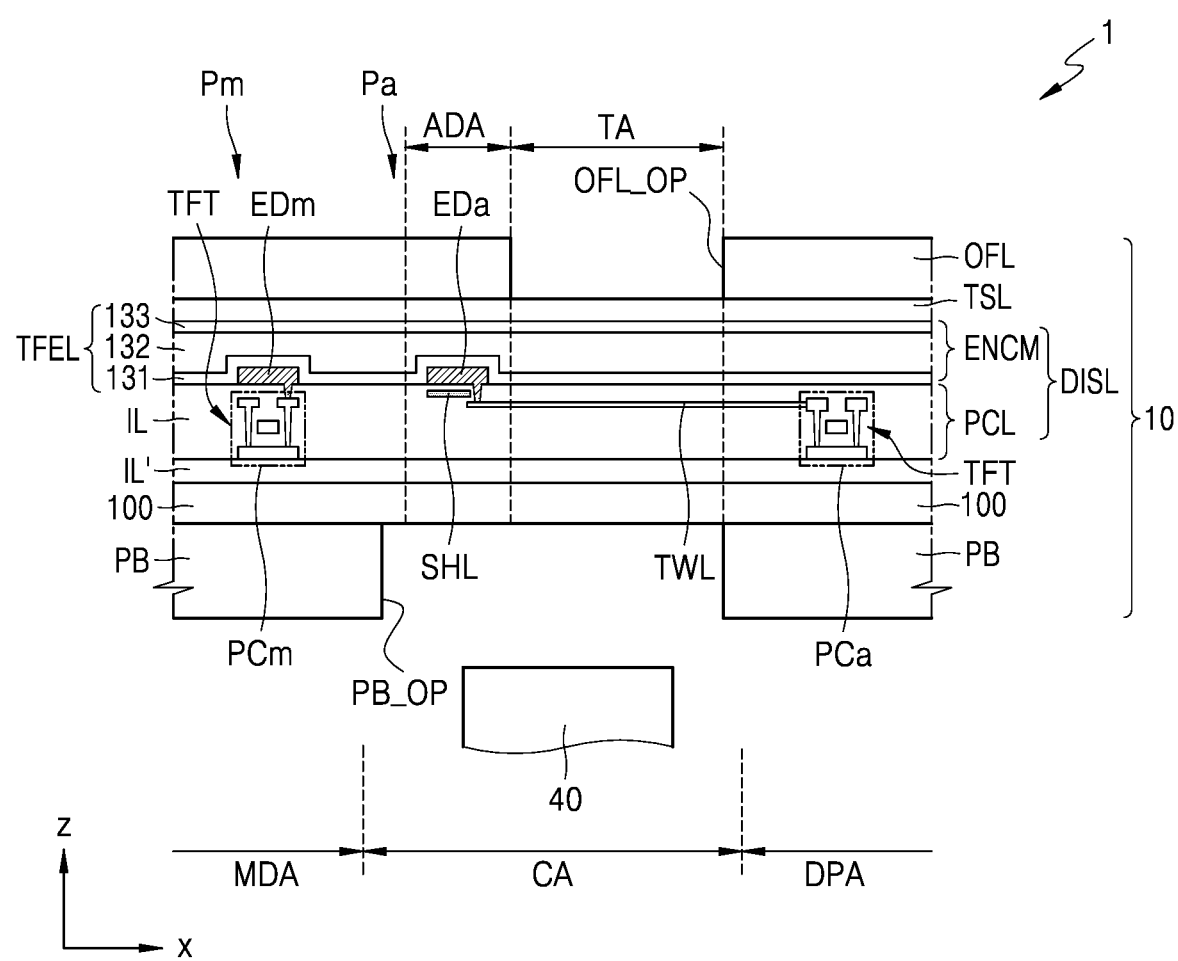
FIGS. 2A-2B are cross-sectional views partially showing a display apparatus according to one or more embodiments.
Figure 2B:
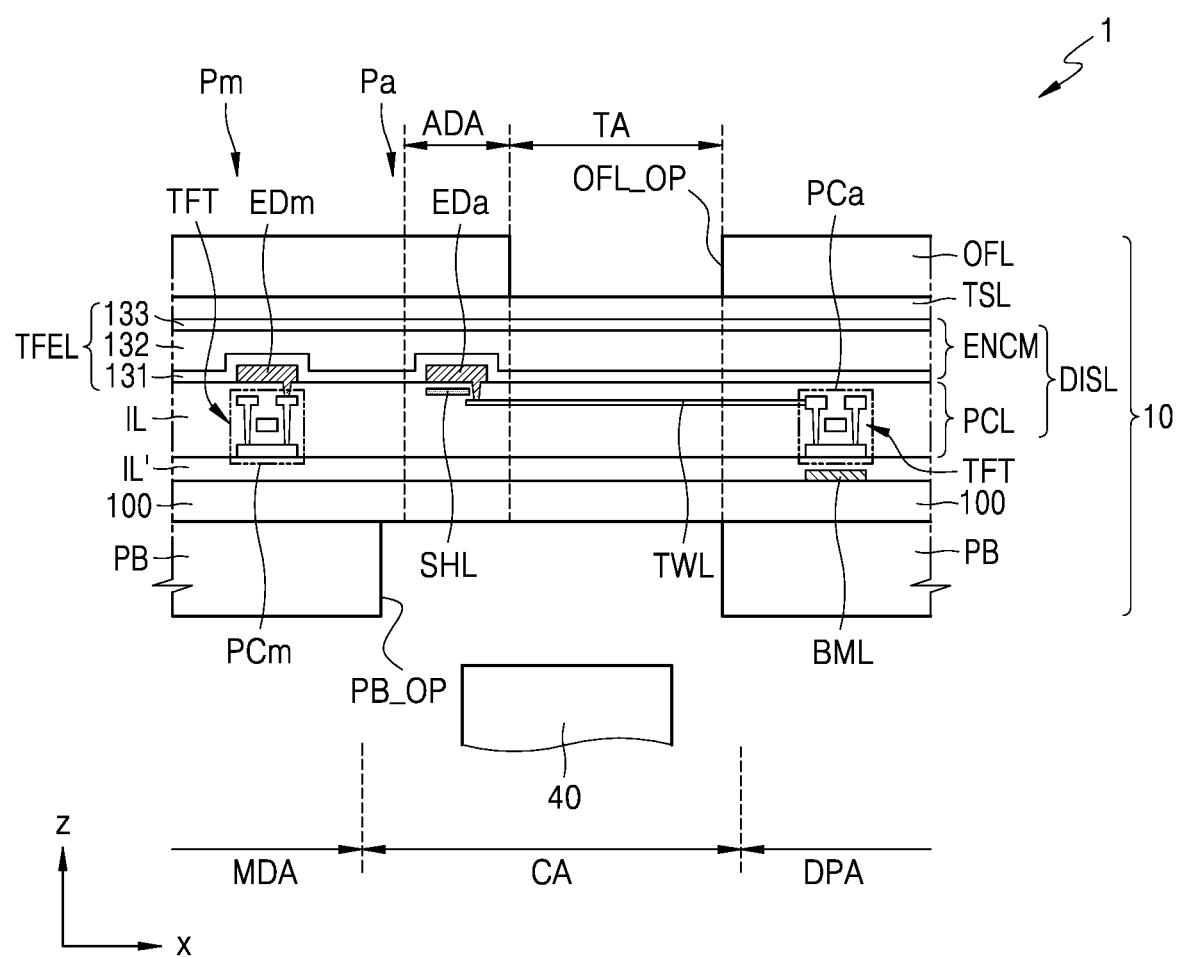

FIGS. 2A and 2B are cross-sectional views partially showing the display apparatus 1 according to one or more embodiments.

Referring to FIG. 2A, the display apparatus 1 may include a display panel 10, and the component 40 overlapping with the display panel 10. A cover window for protecting the display panel 10 may be further provided above the display panel 10.

The display panel 10 may include the component area CA as a region overlapping with the component 40, and the main display area MDA for displaying main images. The display panel 10 may include a substrate 100, a display layer DISL on the substrate 100, a touch screen layer TSL, an optical functional layer OFL, and a panel protective member PB under (e.g., underneath) the substrate 100.

The display layer DISL may include a circuit layer PCL including a plurality of thin film transistors TFT, light-emitting elements EDm and EDa that are display elements, and an encapsulation member ENCM, for example, such as a thin film encapsulation layer TFEL shown in FIG. 2A, or a sealing substrate. Insulating layers IL and IL' may be between the substrate 100 and the display layer DISL, and in the display layer DISL.

The substrate 100 may include an insulating material, for example, such as glass, quartz, and/or a polymer resin. The substrate 100 may include a rigid substrate, or a flexible substrate that may be bendable, foldable, and/or rollable.

A first pixel circuit (e.g., a main pixel circuit) PCm, and a first light-emitting element (e.g., a main light-emitting device) EDm connected to the first pixel circuit PCm may be at (e.g., in or on) the main display area MDA of the display panel 10. The first pixel circuit PCm may include at least one thin film transistor TFT, and may control a light emission from the first light-emitting element EDm. The first sub-pixel Pm may be implemented by the light emission from the first light-emitting element EDm.

A second light-emitting element (e.g., an auxiliary light-emitting element) EDa may be at (e.g., in or on) the component area CA of the display panel 10 to implement the second sub-pixel Pa. In the present embodiment, the second pixel circuit (e.g., an auxiliary pixel circuit) PCa may not be at (e.g., in or on) the component area CA, but may be at (e.g., in or on) the peripheral area DPA that is the non-display area. In another embodiment, the second pixel circuit PCa may be partially at (e.g., in or on) the main display area MDA, or may be between the main display area MDA and the component area CA. In other words, the second pixel circuit PCa may be provided (e.g., may be located) to not overlap with the second light-emitting element EDa.

The second pixel circuit PCa may include at least one thin film transistor TFT, and may be electrically connected to the second light-emitting element EDa via a connecting line TWL. The connecting line TWL may include a transparent conductive material. The second pixel circuit PCa may control the light emission from the second light-emitting element EDa. The second sub-pixel Pa may be implemented by the light emission from the second light-emitting element EDa. At (e.g., in or on) the component area CA, a region where the second light-emitting element EDa is provided (e.g., is located) may be referred to as an auxiliary pixel area ADA.

Also, at (e.g., in or on) the component area CA, a region where the second light-emitting element EDa, which is a display element, is not provided may be referred to as a transmission area TA. The transmission area TA may be a region through which light and/or a signal that is emitted from the component 40 or light and/or a signal that is incident on the component 40 that corresponds to the component area CA may be transmitted. The auxiliary pixel area ADA and the transmission area TA may be alternately arranged at (e.g., in or on) the component area CA. The connecting line TWL for connecting the second pixel circuit PCa and the second light-emitting element EDa to each other may be at (e.g., in or on) the transmission area TA. The connecting line TWL may include a transparent conductive material having a high transmittance, and thus, even when the connecting line TWL is at (e.g., in or on) the transmission area TA, the transmittance of the transmission area TA may be secured.

In the present embodiment, because the second pixel circuit PCa is not located at (e.g., in or on) the component area CA, an area of the transmission area TA may be ensured, and the light transmittance thereof may be further improved.

In the present embodiment, an opaque layer SHL that is a light-absorbing layer may be located at (e.g., in or on) the component area CA. The opaque layer SHL may be under (e.g., underneath) a reflective layer at (e.g., in or on) the component area CA. The opaque layer SHL may be immediately under (e.g., directly underneath) the reflective layer to be in contact with the reflective layer, or one or more insulating layers may be between the reflective layer and the opaque layer SHL. The reflective layer may not be located between the opaque layer SHL and the substrate 100 at (e.g., in or on) the component area CA. Here, the reflective layer may have a reflectivity of a suitable value (e.g., a predetermined or certain value) or greater, and a transmittance of a suitable value (e.g., a predetermined or certain value) or less. In an embodiment, the reflective layer at (e.g., in or on) the component area CA may include (e.g., may be) a pixel electrode (e.g., an anode) included in the second light-emitting element EDa.

Because light reflected from the component 40, for example, such as a lens of a camera, may be reflected by the pixel electrode included in the second light-emitting element EDa at (e.g., in or on) the component area CA, and then may be incident to the camera again, a ghost effect or a flare effect may occur in an image captured by the camera. In the present embodiment, the opaque layer SHL may be between the substrate 100 and the pixel electrode at a location corresponding to the auxiliary pixel area ADA. Accordingly, the light incident to the pixel electrode may be absorbed, and light reflection from the pixel electrode may be prevented or reduced, and thus, the ghost effect and the flare effect in the image captured by the camera may be reduced.

The circuit layer PCL and the display elements (e.g., EDm and EDa) may be covered by the thin film encapsulation layer TFEL, or by the encapsulation substrate. In one or more embodiments, the thin film encapsulation layer TFEL may include at least one inorganic encapsulation layer, and at least one organic encapsulation layer as shown in FIG. 2A. In an embodiment, the thin film encapsulation layer TFEL may include first and second inorganic encapsulation layers 131 and 133, and an organic encapsulation layer 132 between the first and second inorganic encapsulation layers 131 and 133.

The first and second inorganic encapsulation layers 131 and 133 may each include one or more inorganic insulating materials, for example, such as silicon oxide ($SiO_2$), silicon nitride (SiNx), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_2$), and may be formed by a chemical vapor deposition (CVD) method and/or the like. The organic encapsulation layer 132 may include a polymer-based material. The polymer-based material may include a silicon-based resin, an acryl-based resin, an epoxy-based resin, polyimide, polyethylene, and/or the like.

The first inorganic encapsulation layer 131, the organic encapsulation layer 132, and the second inorganic encapsulation layer 133 may be integrally provided to cover the main display area MDA and the component area CA.

When the encapsulation member ENCM is an encapsulation substrate, the encapsulation substrate may be provided to face the substrate 100 with the display element therebetween. A gap may be between the encapsulation substrate and the display element. The encapsulation substrate may include glass. A sealant including a frit and/or the like may be between the substrate 100 and the encapsulation substrate, and the sealant may be located at (e.g., in or on) the peripheral area DPA. The sealant at (e.g., in or on) the peripheral area DPA may surround (e.g., around a periphery of) the display area DA to prevent or substantially prevent moisture from infiltrating through side surfaces.

The touch screen layer TSL may obtain coordinate information according to an external input, for example, such as a touch event. The touch screen layer TSL may include a touch electrode, and touch lines connected to the touch electrode. The touch screen layer TSL may sense an external input according to a self-capacitance method or a mutual capacitance method.

The touch screen layer TSL may be on the thin film encapsulation layer TFEL. As another example, the touch screen layer TSL may be separately formed on a touch substrate, and then may be connected onto the thin film encapsulation layer TFEL via an adhesive layer, for example, such as an optical clear adhesive (OCA). In an embodiment, the touch screen layer TSL may be directly on the thin film encapsulation layer TFEL, and in this case, the adhesive layer may not be provided between the touch screen layer TSL and the thin film encapsulation layer TFEL.

The optical functional layer OFL may include an anti-reflection layer. The anti-reflection layer may reduce a reflectivity of light (e.g., external light) that is incident to the display apparatus 1 from outside.

In some embodiments, the optical functional layer OFL may include a polarization film. The optical functional layer OFL may include an opening OFL_OP corresponding to the transmission area TA. Accordingly, the light transmittance of the transmission area TA may be noticeably improved. A transparent material, for example, such as an optically clear resin (OCR), may be filled in the opening OFL_OP.

In some embodiments, the optical functional layer OFL may include a filter plate including a black matrix and color filters.

In some embodiments, the optical functional layer OFL may further include a multi-layered structure on the anti-reflection layer. The multi-layered structure may include a first layer, and a second layer on the first layer. The first layer and the second layer may include an organic insulating material, and may have different refractive indices from each other. For example, the refractive index of the second layer may be greater than that of the first layer.

A cover window may be further on the display panel 10 to protect the display panel 10. The optical functional layer OFL may be attached to (e.g., adhered to) the cover window via an optically clear adhesive, or may be attached to (e.g., adhered to) the touch screen layer TSL via an optically clear adhesive.

The panel protective member PB is attached to a lower portion (e.g., a rear surface) of the substrate 100 in order to support and protect the substrate 100. The panel protective member PB may include an opening PB_OP corresponding to the component area CA. When the panel protective member PB includes the opening PB_OP, the light transmittance of the component area CA may be improved. The panel protective member PB may include polyethylene terephthalate (PET) or polyimide (PI).

An area of the component area CA may be greater than an area of a region at (e.g., in or on) which the component 40 is arranged. Accordingly, an area of the opening PB_OP in the panel protective member PB may be different than (e.g., may not be equal to) that of the component area CA.

In some embodiments, a plurality of components 40 may be located at (e.g., in or on) the component area CA. The plurality of components 40 may have different functions from one another. For example, the plurality of components 40 may include at least two from among a camera (e.g., an imaging device), a solar battery, a flash, a proximity sensor, an illuminance sensor, and/or an iris sensor.

In FIG. 2A, a bottom metal layer BML is not located under (e.g., underneath) the second pixel circuit PCa at (e.g., in or on) the peripheral area DPA, but as shown in FIG. 2B, the display apparatus 1 according to some embodiments may include the bottom metal layer BML under (e.g., underneath) the second pixel circuit PCa. The bottom metal layer BML may be between the substrate 100 and the second pixel circuit PCa, so as to overlap with the second pixel circuit PCa. The bottom metal layer BML may prevent or substantially prevent the external light from reaching the second pixel circuit PCa.

Figure 3A:
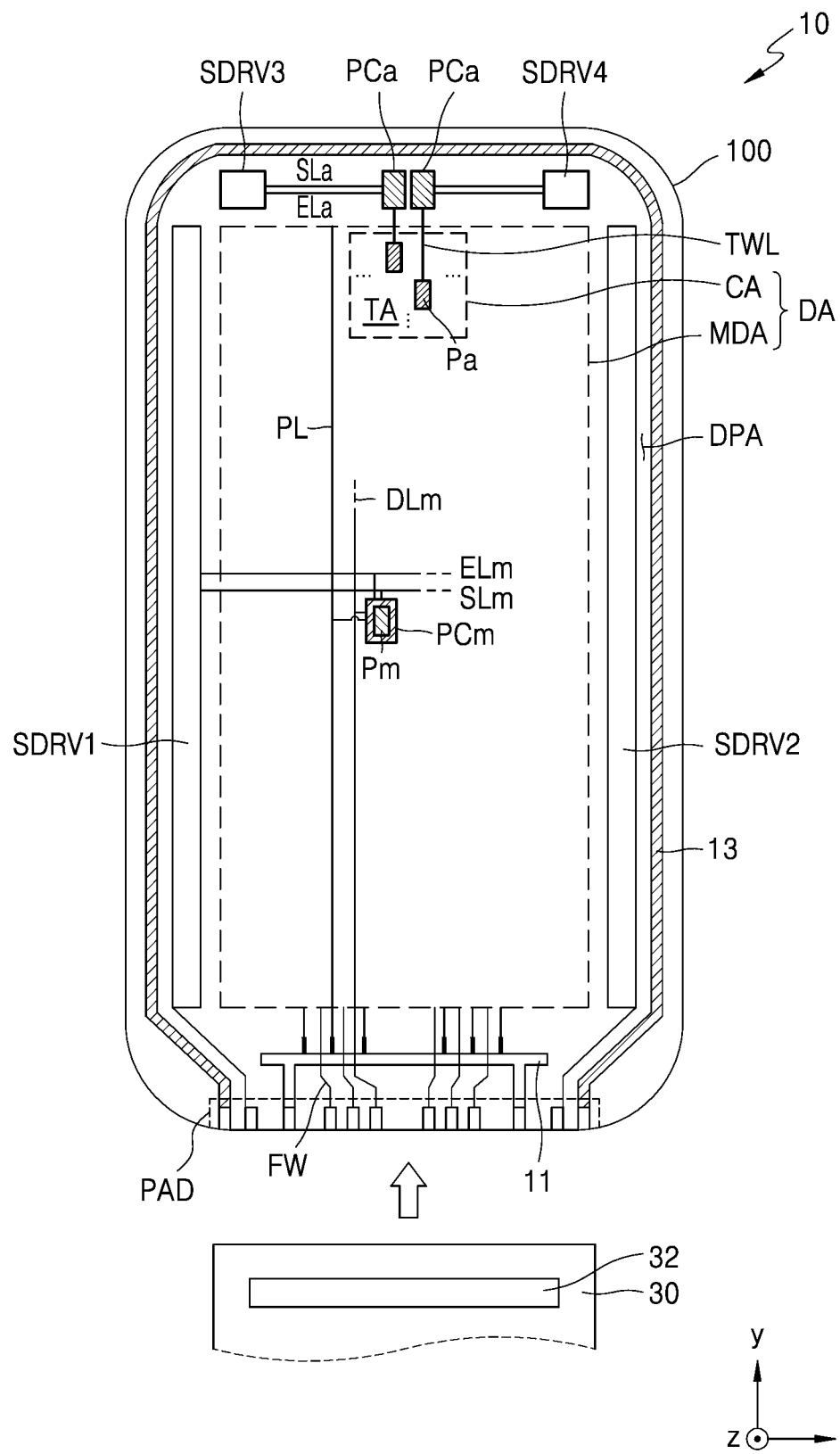
FIGS. 3A-3B are plan views of a display panel that may be included in the display apparatus of FIG. 1.
Figure 3B:
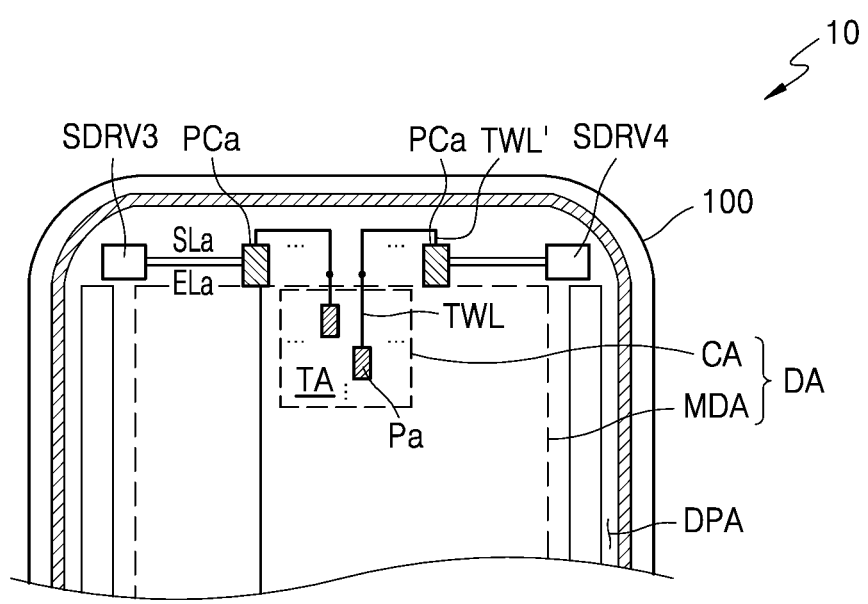

FIGS. 3A and 3B are plan views of the display panel 10 that may be included in the display apparatus of FIG. 1.

Referring to FIG. 3A, various elements of the display panel 10 are on the substrate 100. The substrate 100 includes the display area DA, and the peripheral area DPA surrounding (e.g., around a periphery of) the display area DA. The display area DA may include the main display area MDA for displaying a main image, and the component area CA for displaying an auxiliary image and including the transmission area TA. The auxiliary image may form one whole image (e.g., one total image) with the main image, or may be an image independent from the main image.

The plurality of first sub-pixels Pm are at (e.g., in or on) the main display area MDA. Each of the plurality of first sub-pixels Pm may be implemented as a display element, for example, such as an organic light-emitting diode OLED. The first pixel circuit PCm for driving the first sub-pixel Pm is at (e.g., in or on) the main display area MDA, and may overlap with the first sub-pixel Pm. Each of the first sub-pixels Pm may emit, for example, a red light, a green light, a blue light, or a white light. The main display area MDA is covered by the encapsulation member to be protected from external air and/or moisture.

The component area CA may be at a side of the main display area MDA as described above, or may be at (e.g., in or on) the display area DA to be surrounded (e.g., around a periphery thereof) by the main display area MDA. The plurality of second sub-pixels Pa are at (e.g., in or on) the component area CA. Each of the second sub-pixels Pa may include a display element, for example, such as an organic light-emitting diode. The second pixel circuit PCa for driving the second sub-pixel Pa may be at (e.g., in or on) a region of the peripheral area DPA that is adjacent to the component area CA. For example, when the component area CA is at (e.g., in or on) an upper side of the display area DA, the second pixel circuit PCa may be at (e.g., in or on) a portion of the peripheral area DPA adjacent to the upper side. The second pixel circuit PCa and the display element included in the second sub-pixel Pa may be connected to each other via the connecting line TWL, which may extend in the y-direction. Each of the second sub-pixels Pa may emit, for example, a red light, a green light, a blue light, or a white light. The component area CA is covered by the encapsulation member to be protected from external air and/or moisture.

The component area CA may include the transmission area TA. For example, the transmission area TA may surround (e.g., around a periphery of) the plurality of second sub-pixels Pa. As another example, the transmission area TA may be arranged as gratings with the plurality of second sub-pixels Pa.

Because the component area CA includes the transmission area TA, a resolution of the component area CA may be less than that of the main display area MDA. For example, the resolution of the component area CA may be about ½, ⅜, ⅓, ¼, 2/9, ⅛, 1/9, 1/16, or the like of the resolution of the main display area MDA. For example, the main display area MDA may have a resolution of about 400 ppi, and the component area CA may have a resolution of about 200 ppi or about 100 ppi.

The first and second pixel circuits PCm and PCa for driving the first and second sub-pixels Pm and Pa may be electrically connected to external circuits at (e.g., in or on) the peripheral area DPA, respectively. First to fourth scan driving circuits SDRV1 to SDRV4, a terminal portion PAD, a driving voltage supply line 11, and a common voltage supply line 13 may be at (e.g., in or on) the peripheral area DPA.

The first scan driving circuit SDRV1 and the second scan driving circuit SDRV2 face each other with the main display area MDA therebetween, and may be at a left side of the substrate 100 and a right side of the substrate 100, respectively, at (e.g., in or on) the peripheral area DPA. The first scan driving circuit SDRV1 may apply a scan signal to each of the first pixel circuits PCm that drive the first sub-pixels Pm via a main scan line SLm. The first scan driving circuit SDRV1 may apply an emission control signal to each of at least some of the first pixel circuits PCm via a main emission control line ELm. The second scan driving circuit SDRV2 may be opposite to the first scan driving circuit SDRV1 based on the main display area MDA, and may be located to be in parallel or substantially in parallel with the first scan driving circuit SDRV1. Some of the first pixel circuits PCm of the first sub-pixels Pm at (e.g., in or on) the main display area MDA may be electrically connected to the first scan driving circuit SDRV1, and others of the first pixel circuits PCm may be electrically connected to the second scan driving circuit SDRV2.

The third scan driving circuit SDRV3 and the fourth scan driving circuit SDRV4 face each other with the second pixel circuit PCa therebetween, and may be located at left and right sides of the peripheral area DPA, respectively, at the upper side of the substrate 100. The third scan driving circuit SDRV3 and the fourth scan driving circuit SDRV4 may apply a scan signal to the second pixel circuits PCa for driving the second sub-pixel Pa (e.g., in or on) the component area CA via an auxiliary scan line SLa. The third scan driving circuit SDRV3 and the fourth scan driving circuit SDRV4 may apply an emission control signal to the second pixel circuits PCa via an auxiliary emission control line ELa. Some of the second pixel circuits PCa of the second sub-pixels Pa may be electrically connected to the third scan driving circuit SDRV3, and others of the second pixel circuits PCa may be electrically connected to the fourth scan driving circuit SDRV4.

The terminal portion PAD may be at a side of the substrate 100. The terminal portion PAD may not be covered by the insulating layer, and may be exposed to be connected to a display circuit board 30. A display driver 32 may be located on the display circuit board 30.

The display driver 32 may generate control signals that are to be transferred to the first to fourth scan driving circuits SDRV1 to SDRV4. The display driver 32 may generate a data signal, and the data signal may be transferred to the main pixel circuits PCm via a fan-out line FW, and a main data line DLm connected to the fan-out line FW.

The display driver 32 may also supply a driving voltage ELVDD to the driving voltage supply line 11, and may supply a common voltage ELVSS to the common voltage supply line 13. The driving voltage ELVDD is applied to the first and second pixel circuits PCm and PCa of the first and second sub-pixels Pm and Pa via a driving voltage line PL connected to the driving voltage supply line 11. The common voltage ELVSS may be connected to the common voltage supply line 13 to be applied to an opposite electrode of the display element.

The driving voltage supply line 11 may extend in the x-direction below the main display area MDA. The common voltage supply line 13 may have a loop shape having one open side to partially surround (e.g., around a periphery of) the main display area MDA.

FIG. 3A shows one component area CA, but a plurality of component areas CA may be provided. In this case, the plurality of component areas CA are spaced apart (e.g., are separated) from one another. As an example, a first camera may correspond to one component area CA, and a second camera may correspond to another component area CA. As another example, a camera may correspond to one component area CA, and an infrared ray sensor may correspond to another component area CA. The shapes and/or sizes of the plurality of component areas CA may be different from one another.

The component area CA may have a circular shape, an elliptical shape, a polygonal shape, or a non-defined shape. In some embodiments, the component area CA may have an octagonal shape. The component area CA may have various suitable polygonal shapes, for example, such as a rectangular shape, a hexagonal shape, and/or the like. The component area CA may be surrounded (e.g., around a periphery thereof) by the main display area MDA.

In FIG. 3A, the second pixel circuit PCa is shown as being arranged to be adjacent to an outer side of the component area CA, but the present disclosure is not limited thereto. As shown in FIG. 3B, the second pixel circuit PCa may be arranged to be adjacent to an outer side of the main display area MDA. In some embodiments, the connecting line TWL may be connected to the second pixel circuit PCa via an additional connecting line TWL' (e.g., see FIG. 3B). In this case, the connecting line TWL may be at (e.g., in or on) the component area CA, and the additional connecting line TWL' may be at (e.g., in or on) the peripheral area DPA. The connecting line TWL may include a transparent conductive material, and the additional connecting line TWL' may include a highly conductive metal. In some embodiments, the additional connecting line TWL' may be at the same layer as that of the connecting line TWL. In another embodiment, the additional connecting line TWL' may be at a different layer from that of the connecting line TWL, and may be connected to the connecting line TWL via a contact hole.

When the second pixel circuit PCa and the display element included in the second sub-pixel Pa are connected to each other via the connecting line TWL and the additional connecting line TWL', the connecting line TWL and the additional connecting line TWL' may be referred to as a first connecting line and a second connecting line, respectively.

Figure 4:
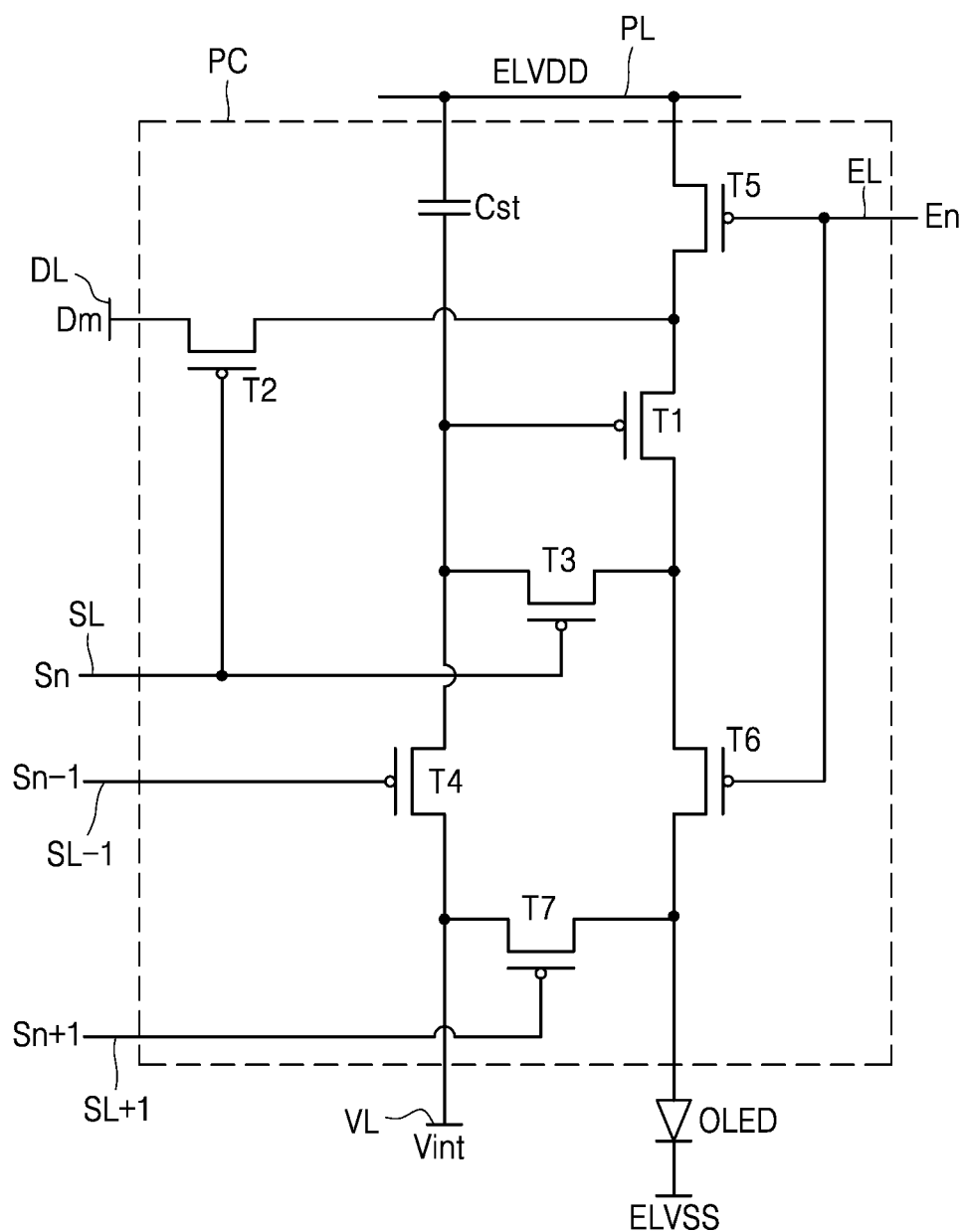
FIG. 4 is an equivalent circuit diagram of a pixel circuit according to an embodiment.

FIG. 4 is an equivalent circuit diagram of a pixel circuit PC according to an embodiment. FIG. 4 may be an equivalent circuit diagram of the first pixel circuit PCm and/or the second pixel circuit PCa. Hereinafter, the first pixel circuit PCm and/or the second pixel circuit PCa will be referred to as the pixel circuit PC for convenience of description.

Referring to FIG. 4, the pixel circuit PC may include a first transistor (e.g., a driving thin film transistor) T1, a second transistor (e.g., a switching thin film transistor) T2, a third transistor (e.g., a compensation thin film transistor) T3, a fourth transistor (e.g., a first initialization thin film transistor) T4, a fifth transistor (e.g., a first emission control thin film transistor) T5, a sixth transistor (e.g., a second emission control thin film transistor) T6, a seventh transistor (e.g., a second initialization thin film transistor) T7, and a capacitor Cst.

FIG. 4 shows that every pixel circuit PC includes signal lines SL, SL−1, SL+1, EL, and DL, an initialization voltage line VL, and the driving voltage line PL, but the present disclosure is not limited thereto. For example, in another embodiment, at least one of the signal lines SL, SL−1, SL+1, EL, and DL, and/or the initialization voltage line VL may be shared by neighboring pixel circuits (e.g., by adjacent pixel circuits).

A drain electrode of the first transistor T1 may be electrically connected to an organic light-emitting diode OLED, which is a display element, via the sixth transistor T6. The first transistor T1 receives a data signal Dm according to a switching operation of the second transistor T2, and may supply a driving current to the organic light-emitting diode OLED.

A gate electrode of the second transistor T2 is connected to the scan line SL, and a source electrode of the second transistor T2 is connected to the data line DL. A drain electrode of the second transistor T2 is connected to a source electrode of the first transistor T1, and may be connected to the driving voltage line PL via the fifth transistor T5.

The second transistor T2 is turned on according to a scan signal Sn received through the scan line SL, and performs a switching operation to transfer the data signal Dm transferred through the data line DL to the source electrode of the first transistor T1.

A gate electrode of the third transistor T3 may be connected to the scan line SL. A source electrode of the third transistor T3 is connected to the drain electrode of the first transistor T1, and may be connected to the pixel electrode of the organic light-emitting diode OLED via the sixth transistor T6. A drain electrode of the third transistor T3 may be connected to a first electrode of the capacitor Cst, a source electrode of the fourth transistor T4, and the gate electrode of the first transistor T1. The third transistor T3 is turned on according to the scan signal Sn transferred through the scan line SL, and connects the gate electrode and the drain electrode of the first transistor T1 to each other to diode-connect the first transistor T1, such that a threshold voltage of the first transistor T1 may be compensated for.

A gate electrode of the fourth transistor T4 may be connected to a previous scan line SL−1. A drain electrode of the fourth transistor T4 may be connected to the initialization voltage line VL. The source electrode of the fourth transistor T4 may be connected to the first electrode of the capacitor Cst, the drain electrode of the third transistor T3, and the gate electrode of the first transistor T1. The fourth transistor T4 is turned on according to a previous scan signal Sn−1 transferred through the previous scan line SL−1 to transfer an initialization voltage Vint to the gate electrode of the first transistor T1, and performs an initialization operation for initializing a voltage at the gate electrode of the first transistor T1.

A gate electrode of the fifth transistor T5 may be connected to the emission control line EL. A source electrode of the fifth transistor T5 may be connected to the driving voltage line PL. A drain electrode of the fifth transistor T5 is connected to the source electrode of the first transistor T1 and the drain electrode of the second transistor T2.

A gate electrode of the sixth transistor T6 may be connected to the emission control line EL. A source electrode of the sixth transistor T6 may be connected to the drain electrode of the first transistor T1 and the source electrode of the third transistor T3. A drain electrode of the sixth transistor T6 may be electrically connected to the pixel electrode of the organic light-emitting diode OLED. The fifth transistor T5 and the sixth transistor T6 are concurrently (e.g., simultaneously) turned on according to an emission control signal En transferred through the emission control line EL to transfer the driving voltage ELVDD to the organic light-emitting diode OLED, thus, and a driving current flows through the organic light-emitting diode OLED.

A gate electrode of the seventh transistor T7 may be connected to a next scan line SL+1. A source electrode of the seventh transistor T7 may be connected to the pixel electrode of the organic light-emitting diode OLED. A drain electrode of the seventh transistor T7 may be connected to the initialization voltage line VL. The seventh transistor T7 is turned on according to a post scan signal (e.g., a next scan signal) Sn+1 transferred through the next scan line SL+1 to initialize the pixel electrode of the organic light-emitting diode OLED.

FIG. 4 shows an example in which the fourth transistor T4 and the seventh transistor T7 are connected to the previous scan line SL−1 and the next scan line SL+1, respectively, but the present disclosure is not limited thereto. For example, in another embodiment, both the fourth transistor T4 and the seventh transistor T7 may be connected to the previous scan line SL−1 to be operated according to the previous scan signal Sn−1.

A second electrode of the capacitor Cst may be connected to the driving voltage line PL. The first electrode of the capacitor Cst may be connected to the gate electrode of the first transistor T1, the drain electrode of the third transistor T3, and the source electrode of the fourth transistor T4.

An opposite electrode (e.g., a cathode) of the organic light-emitting diode OLED may receive a supply of the common voltage ELVSS. The organic light-emitting diode OLED emits light after receiving the driving current from the first transistor T1.

The pixel circuit PC is not limited to the number and circuit design of the transistors and the capacitor illustrated in FIG. 4, and the number and/or the circuit design may be variously modified as needed or desired.

Figure 5:
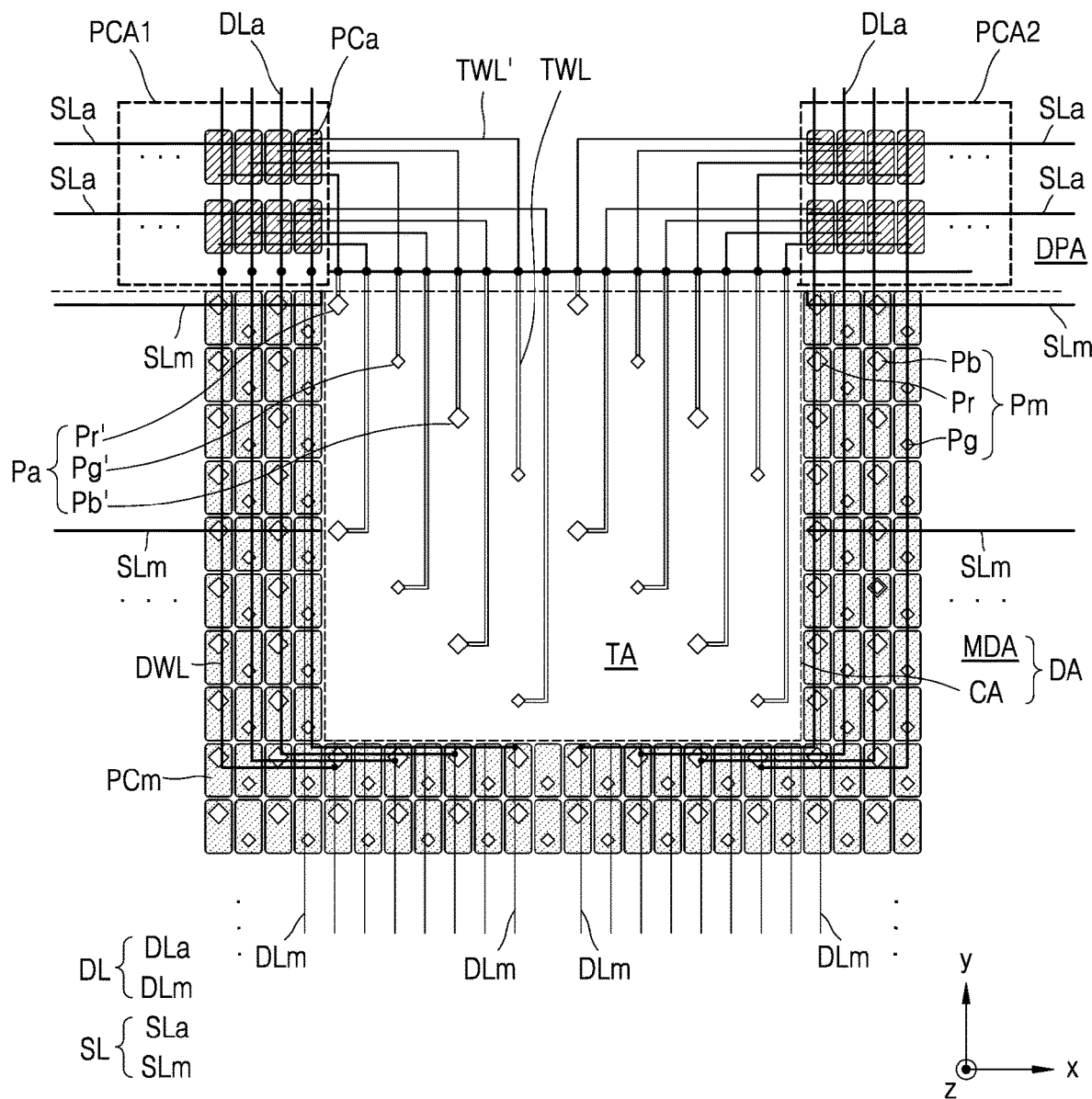
FIG. 5 is a plan layout showing a region of a display panel according to an embodiment.

FIG. 5 is a plan layout showing a region of a display panel according to an embodiment. In more detail, FIG. 5 shows the component area CA, a part of the main display area MDA around (e.g., adjacent to) the component area CA, and a part of the peripheral area DPA.

Referring to FIG. 5, the plurality of first sub-pixels Pm may be at (e.g., in or on) the main display area MDA. As used in the present specification, a sub-pixel is a minimum unit for realizing an image, and denotes a light-emitting region from which light is emitted by a display element. When an organic light-emitting diode is used as the display element, the light-emitting region may be defined by an opening of a pixel defining layer. This will be described in more detail below. Each of the plurality of first sub-pixels Pm may emit a suitable one of a red light, a green light, a blue light, or a white light.

In some embodiments, the first sub-pixels Pm at (e.g., in or on) the main display area MDA may include a first-color sub-pixel Pr, a second-color sub-pixel Pg, and a third-color sub-pixel Pb. The first-color sub-pixel Pr, the second-color sub-pixel Pg, and the third-color sub-pixel Pb may emit a red light, a green light, and a blue light, respectively. The first sub-pixels Pm may be arranged in an RGBG structure (e.g., a PENTILE® structure, PENTILE® being a duly registered trademark of Samsung Display Co., Ltd.).

For example, from among vertices of a virtual square having a central point at the second-color sub-pixel Pg as a central point of the square, the first-color sub-pixel Pr may be at the first and third vertices, and the third-color sub-pixel Pb may be at the second and fourth vertices. A size of the second-color sub-pixel Pg may be less than those of the first-color sub-pixel Pr and the third-color sub-pixel Pb.

This pixel arrangement structure is referred to as the RGBG structure or an RGBG matrix structure (e.g., the PENTILE® structure or a PENTILE® matrix structure). By applying rendering, in which a color of a pixel is represented by sharing the colors of its adjacent pixels, a high resolution may be obtained via a smaller number of pixels.

FIG. 5 shows that the plurality of first sub-pixels Pm are arranged in the RGBG matrix structure (e.g., the PENTILE® matrix structure), but the present disclosure is not limited thereto. For example, the plurality of first sub-pixels Pm may be arranged in various suitable shapes and structures, for example, such as a stripe structure, a mosaic arrangement structure, a delta arrangement structure, and/or the like.

At (e.g., in or on) the main display area MDA, the first pixel circuits PCm may overlap with the first sub-pixels Pm, and the first pixel circuits PCm may be arranged in the form of a matrix along the x and y directions. In the present specification, the first pixel circuit PCm denotes a unit of a pixel circuit for driving one first sub-pixel Pm.

The plurality of second sub-pixels Pa may be at (e.g., in or on) the component area CA. Each of the plurality of second sub-pixels Pa may emit a suitable one of a red light, a green light, a blue light, or a white light. The second sub-pixels Pa may include a first-color sub-pixel Pr', a second-color sub-pixel Pg', and a third-color sub-pixel Pb'. The first-color sub-pixel Pr', the second-color sub-pixel Pg', and the third-color sub-pixel Pb' may emit a red light, a green light, and a blue light, respectively.

The number of second sub-pixels Pa per unit area at (e.g., in or on) the component area CA may be less than the number of first sub-pixels Pm per unit area at (e.g., in or on) the main display area MDA. For example, the number of the second sub-pixels Pa and the number of first sub-pixels Pm for a same sized unit area may be in a ratio of 1:2, 1:4, 1:8, or 1:9. In other words, a resolution of the component area CA may be ½, ¼, ⅛, or ⅑ of a resolution of the main display area MDA. FIG. 5 shows an example in which the component area CA has a resolution that is about ⅛ of the resolution of the main display area MDA, but the present disclosure is not limited thereto.

The second sub-pixels Pa at (e.g., in or on) the component area CA may be arranged in various suitable shapes and structures. For example, the second sub-pixels Pa may be arranged in units of pixel groups, and in each of the pixel groups, the second sub-pixels Pa may be arranged in various suitable structures, for example, such as a stripe structure, a mosaic arrangement structure, a delta arrangement structure, and/or the like. Here, a distance between the second sub-pixels Pa in a pixel group may be equal to or substantially equal to a distance between the first sub-pixels Pm.

As another example, as shown in FIG. 5, the second sub-pixels Pa may be distributed at (e.g., in or on) the component area CA. In other words, the distance between the second sub-pixels Pa may be greater than the distance between the first sub-pixels Pm. In addition, a region where the second sub-pixels Pa are not provided at (e.g., in or on) the component area CA may be the transmission area TA having high light transmittance.

The second pixel circuits PCa for controlling the light emission from the second sub-pixels Pa may be at (e.g., in or on) the peripheral area DPA. Because the second pixel circuits PCa are not located at (e.g., in or on) the component area CA, the component area CA may have a relatively larger transmission area TA. Also, voltage lines and signal lines for applying a constant voltage and signals to the second pixel circuits PCa are not located at (e.g., in or on) the component area CA, and thus, the second sub-pixels Pa may be variously arranged (e.g., may be freely arranged) without considering the arrangement of the lines.

The second pixel circuits PCa may be distributed at (e.g., in or on) a first pixel circuit area PCA1 and a second pixel circuit area PCA2 that are spaced apart (e.g., that are separated) from each other at (e.g., in or on) the peripheral area DPA. For example, the second pixel circuits PCa for driving the second sub-pixels Pa at the left side of the component area CA from among the second sub-pixels Pa may be located at (e.g., in or on) the first pixel circuit area PCA1. The second pixel circuits PCa for driving the second sub-pixels Pa at the right side of the component area CA from among the second sub-pixels Pa may be located at (e.g., in or on) the second pixel circuit area PCA2.

The first pixel circuit area PCA1 and the second pixel circuit area PCA2 may not correspond to the sides of the component area CA, and may be adjacent to outer sides of the main display area MDA. In other words, the first pixel circuit area PCA1 and the second pixel circuit area PCA2 may be closer to the main display area MDA than to the component area CA. The first pixel circuit area PCA1 and the second pixel circuit area PCA2 may be spaced apart from each other by about a width of the component area CA in the x-direction. However, the present disclosure is not limited thereto. For example, the first pixel circuit area PCA1 and the second pixel circuit area PCA2 may be adjacent to one or more sides of the component area CA.

The second pixel circuits PCa may be connected to the second sub-pixels Pa via the connecting lines TWL and the additional connecting lines TWL'. The connecting line TWL is at (e.g., in or on) the component area CA, and may include a transparent conductive material. For example, the connecting line TWL may include a transparent conducting oxide (TCO). The connecting line TWL may include a conductive oxide, for example, such as indium tin oxide (ITO), indium zinc oxide (IZO), zinc oxide (ZnO), indium oxide ($In_2O_3$), indium gallium oxide, or aluminum zinc oxide (AZO).

The additional connecting line TWL' may be at (e.g., in or on) the peripheral area DPA, and connected to the second pixel circuit PCa. The additional connecting line TWL' may include a conductive material including molybdenum (Mo), aluminum (Al), copper (Cu), titanium (Ti), and/or the like, and may have a single-layer structure or a multi-layered structure. The additional connecting line TWL' may be connected to the connecting line TWL at (e.g., in or on) or near (e.g., adjacent to) an edge of the component area CA.

When the connecting line TWL and the additional connecting line TWL' are connected to the second sub-pixel Pa, this may denote that the connecting line TWL and the additional connecting line TWL' are electrically connected to the pixel electrode of the display element included in the second sub-pixel Pa.

The additional connecting line TWL' and the connecting line TWL may be at the same layer as each other or at different layers from each other. When the additional connecting line TWL' and the connecting line TWL are at different layers from each other, the additional connecting line TWL' and the connecting line TWL may be connected to each other via a contact hole.

The additional connecting line TWL' may have a higher conductivity than that of the connecting line TWL. Because the additional connecting line TWL' is at (e.g., in or on) the peripheral area DPA, there may be no need to ensure light transmittance thereof. Thus, the additional connecting line TWL' may include a material having a lower light transmittance and a higher conductivity than those of the connecting line TWL. Accordingly, a resistance of the connecting line TWL may be reduced.

The scan line SL may include a main scan line SLm connected to the first pixel circuits PCm, and an auxiliary scan line SLa connected to the second pixel circuits PCa.

The main scan line SLm extends in the x-direction at (e.g., in or on) the main display area MDA to be connected to the main pixel circuits PCm that are in the same row as each other. The main scan line SLm may not be at (e.g., in or on) the component area CA. In other words, the main scan line SLm may be disconnected at the component area CA. In this case, the main scan line SLm at a left side of the component area CA may receive a signal from the first scan driving circuit SDRV1, and the main scan line SLm at a right side of the component area CA may receive a signal from the second scan driving circuit SDRV2 (e.g., see FIG. 3A).

The auxiliary scan line SLa extends in the x-direction at (e.g., in or on) the peripheral area DPA, and may be connected to the second pixel circuits PCa that are in the same row as each other. The auxiliary scan line SLa may be disconnected. In this case, the auxiliary scan line SLa at a left side of the component area CA may receive a signal from the third scan driving circuit SDRV3, and the auxiliary scan line SLa at a right side of the component area CA may receive a signal from the fourth scan driving circuit SDRV4 (e.g., see FIG. 3A).

The data line DL may include a main data line DLm connected to the first pixel circuits PCm, and an auxiliary data line DLa connected to the second pixel circuits PCa. The main data line DLm extends in the y-direction, and may be connected to the first pixel circuits PCm that are in the same column as each other. The auxiliary data line DLa extends in the y-direction, and may be connected to the second pixel circuits PCa that are in the same column as each other.

The main data line DLm and the auxiliary data line DLa are connected to each other via a data connecting line DWL, and the first pixel circuit PCm and the second pixel circuit PCa for driving the first sub-pixel Pm and the second sub-pixel Pa that are in the same column as each other may receive the data signals via the same fan-out line FW (e.g., see FIG. 3A). The data connecting line DWL may bypass (e.g., may extend around) the component area CA. The data connecting line DWL may overlap with the first pixel circuits PCm at (e.g., in or on) the main display area MDA. Because the data connecting line DWL is at (e.g., in or on) the main display area MDA, an additional space for arranging the data connecting line DWL may not be used or needed, and thus, an area of a dead space may be reduced.

The data connecting line DWL may be at a different layer from those of the main data line DLm and the auxiliary data line DLa, and thus, the data connecting line DWL may be connected to the main data line DLm and the auxiliary data line DLa via contact holes, respectively.

Figure 6A:
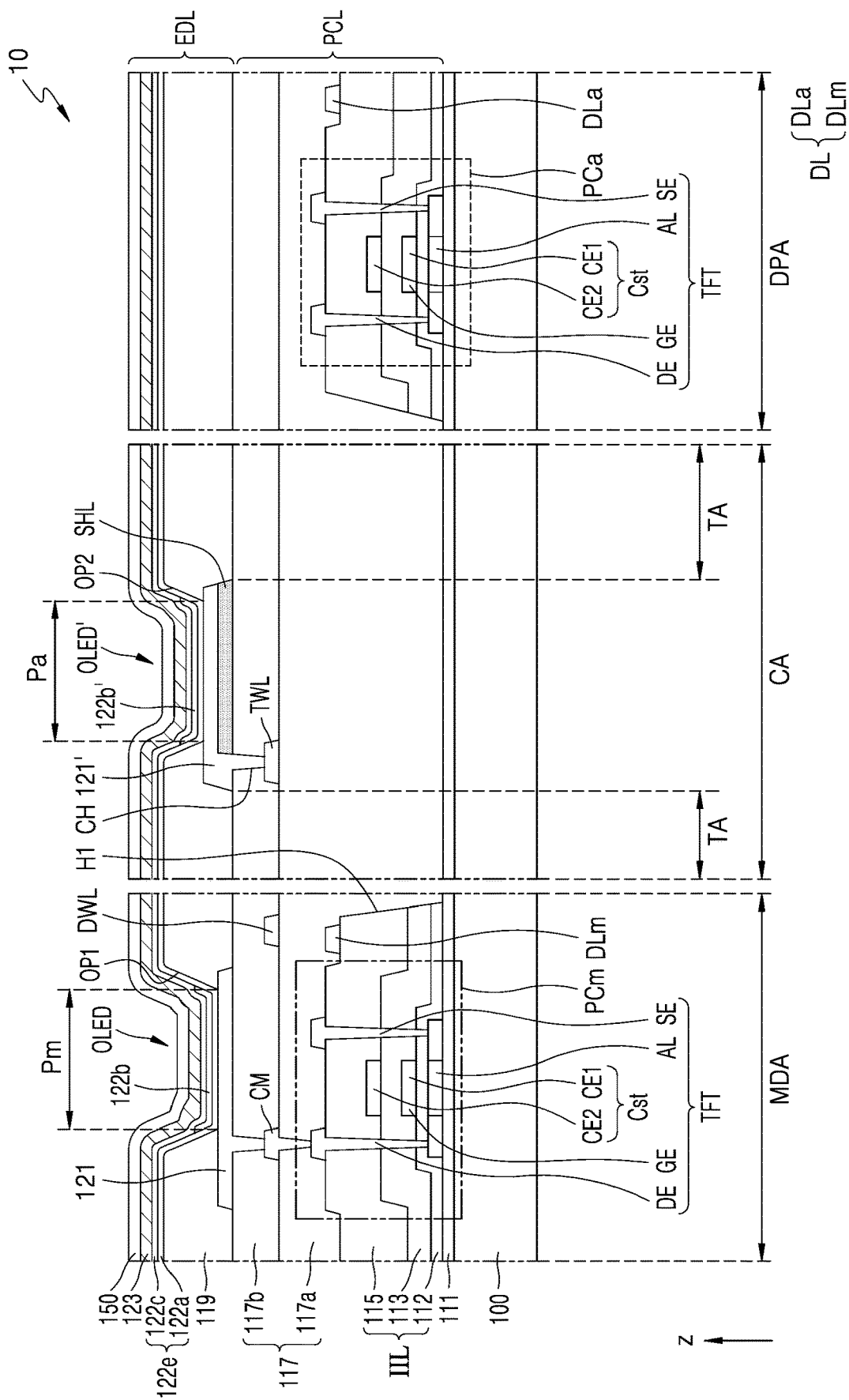
FIGS. 6A-6B are cross-sectional views showing some portions of a display panel according to one or more embodiments.
Figure 6B:
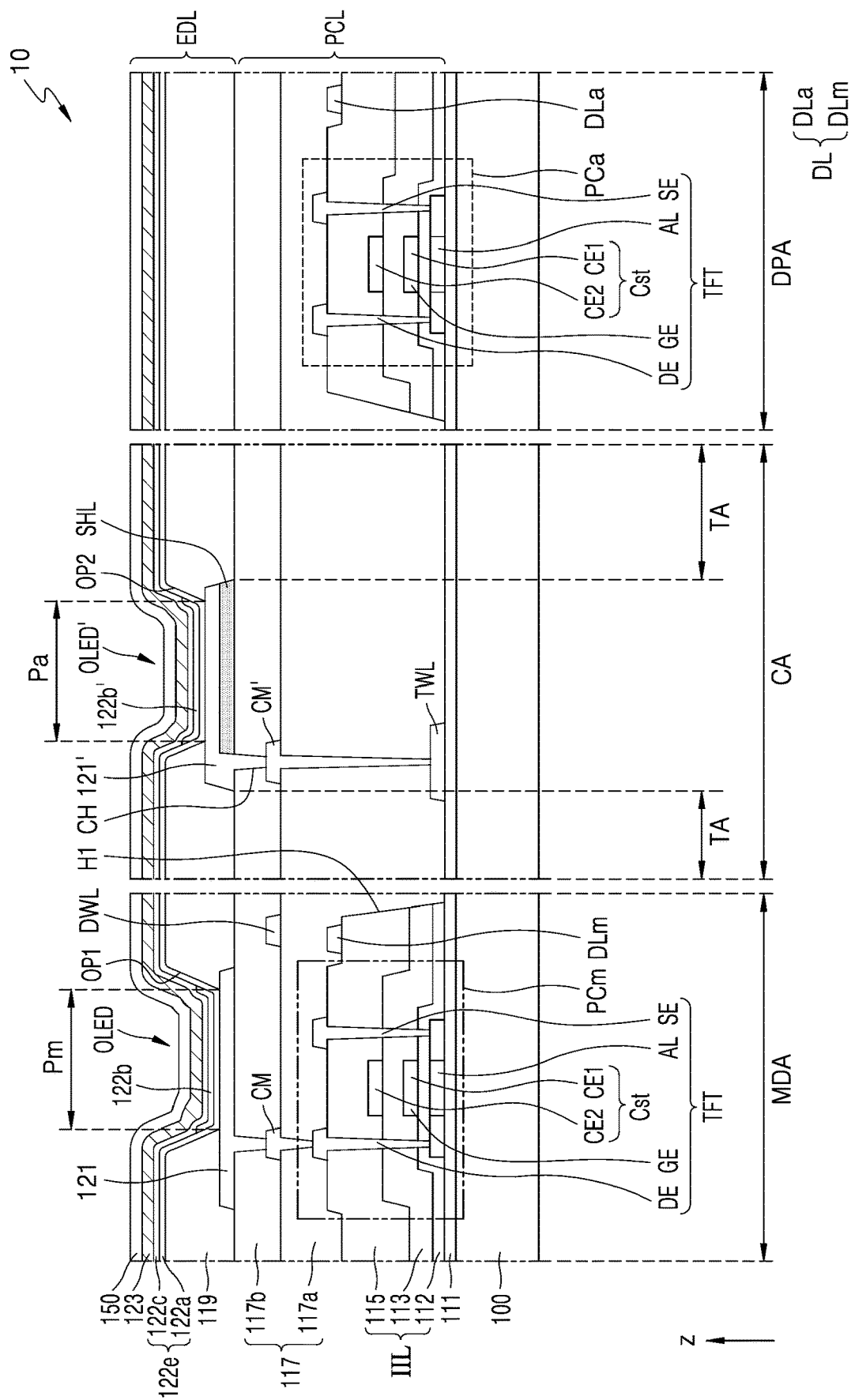
Figure 7:
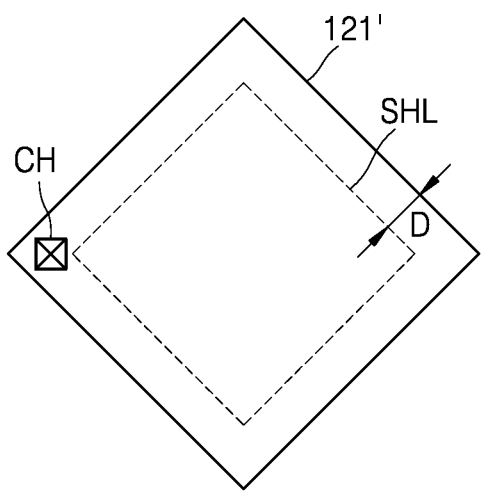
FIG. 7 is a plan view of a second pixel electrode and an opaque layer according to the embodiment of FIG. 6A.
Figure 8A:
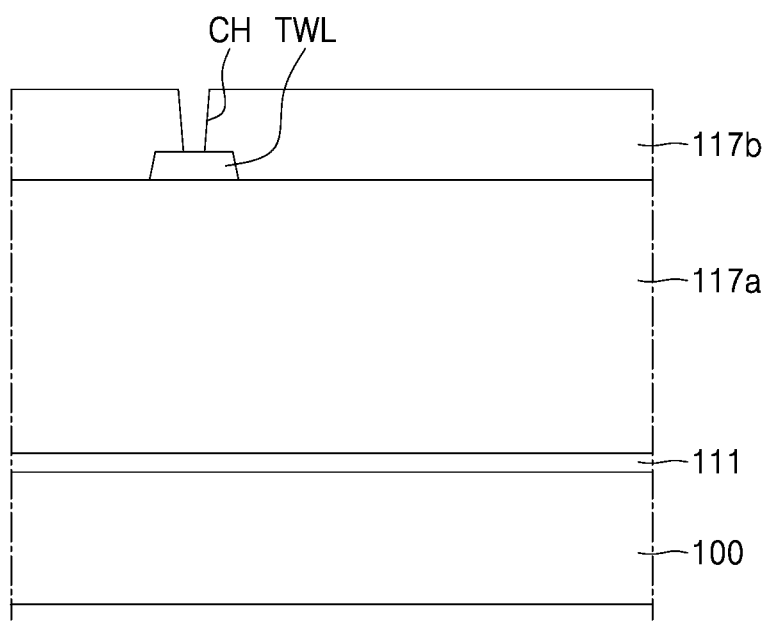
FIGS. 8A-8C are cross-sectional views illustrating various processes of forming the second pixel electrode and the opaque layer according to the embodiment of FIG. 6A.
Figure 8B:
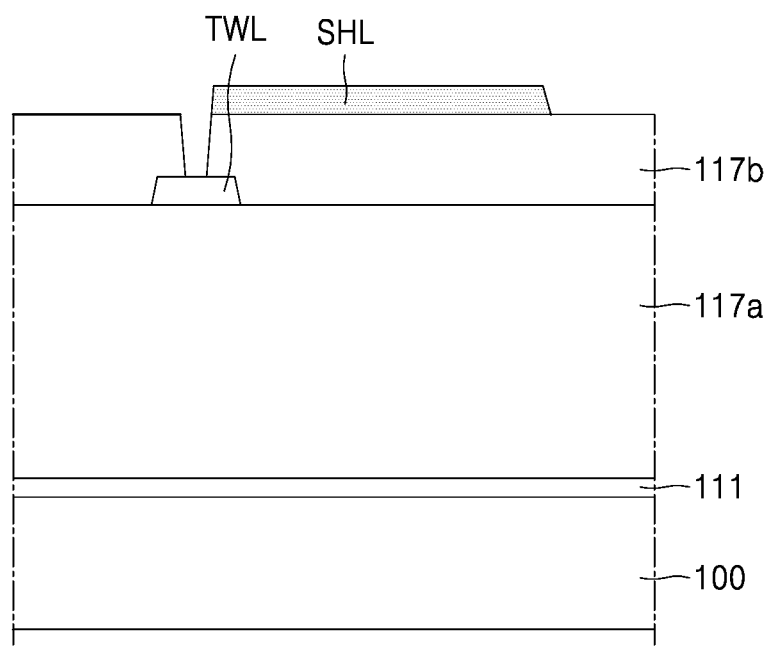
Figure 8C:
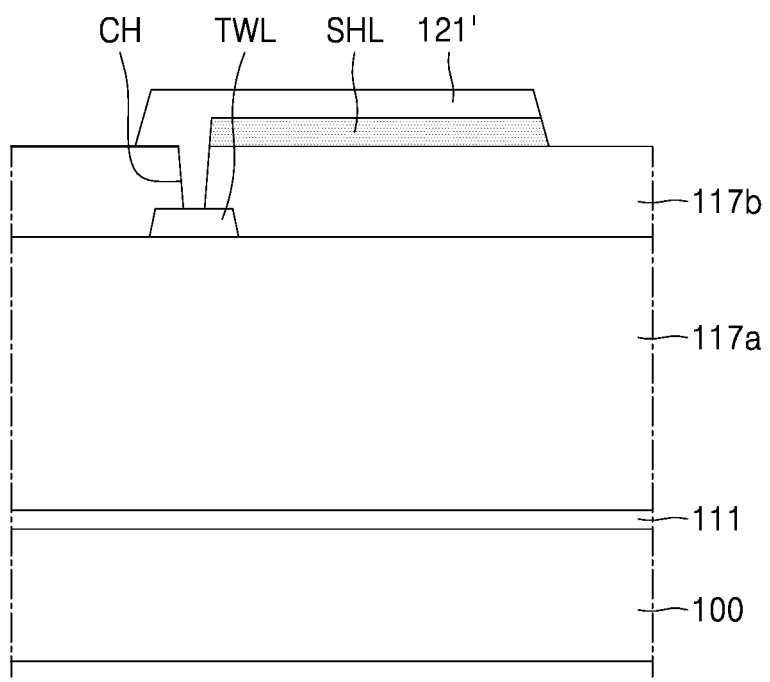

FIGS. 6A and 6B are cross-sectional views showing some portions of a display panel according to one or more embodiments. FIGS. 6A and 6B are cross-sectional views showing some parts of the main display area MDA, the component area CA, and the peripheral area DPA in the display panel 10. FIG. 7 is a plan view of a second pixel electrode and an opaque layer according to the embodiment of FIG. 6A. FIGS. 8A to 8C are cross-sectional views illustrating various processes of forming the second pixel electrode and the opaque layer according to the embodiment of FIG. 6A.

Referring to FIG. 6A, the first sub-pixels Pm are at (e.g., in or on) the main display area MDA, and the second sub-pixels Pa are at (e.g., in or on) the component area CA. The component area CA includes the transmission area TA. The first pixel circuit PCm including the thin film transistor TFT and the capacitor Cst, and a first organic light-emitting diode OLED that is a first display element connected to the first pixel circuit PCm may be at (e.g., in or on) the main display area MDA. A second organic light-emitting diode OLED' may be at (e.g., in or on) the component area CA as a second display element. The second pixel circuit PCa including the thin film transistor TFT and the storage capacitor Cst may be at (e.g., in or on) the peripheral area DPA.

In addition, the connecting line TWL for connecting the second pixel circuit PCa to the second organic light-emitting diode OLED' may be at (e.g., in or on) the component area CA. The thin film transistor TFT shown in FIG. 6A may be an example of one of the transistors shown in FIG. 4.

In the present embodiment, the organic light-emitting diode is used as the display element, but the present disclosure is not limited thereto, and in other embodiments, an inorganic light-emitting diode or a quantum dot light-emitting diode may be used as the display element.

Hereinafter, a structure in which the elements in the display panel 10 are stacked on one another will be described in more detail below. The display panel 10 may include a substrate 100, a buffer layer 111, a circuit layer PCL, and a display element layer EDL that are stacked on one another.

The substrate 100 may include an insulating material, for example, such as glass, quartz, and/or a polymer resin. The substrate 100 may include a rigid substrate, or a flexible substrate that may be bendable, foldable, and/or rollable.

The buffer layer 111 is on the substrate 100 to reduce or block infiltration of impurities, moisture, and/or external air from a lower portion of the substrate 100, and to provide a flat or substantially flat surface on the substrate 100. The buffer layer 111 may include an inorganic material, for example, such as an oxide material or a nitride material, an organic material, or an inorganic-organic composite material, and may have a single-layer structure, or a multi-layered structure including the inorganic material and the organic material. A barrier layer for preventing or reducing infiltration of external air may be further provided between the substrate 100 and the buffer layer 111. In some embodiments, the buffer layer 111 may include silicon oxide (SiO2) or silicon nitride (SiNx).

The circuit layer PCL is on the buffer layer 111, and may include the first and second pixel circuits PCm and PCa, a first gate insulating layer 112, a second gate insulating layer 113, an interlayer insulating layer 115, and a planarization layer 117. The first pixel circuit PCm and the second pixel circuit PCa may each include the thin film transistor TFT and the capacitor Cst.

The thin film transistor TFT may be on the buffer layer 111. The thin-film transistor TFT includes a semiconductor layer AL, a gate electrode GE, a source electrode SE, and a drain electrode DE. The thin film transistor TFT of the first pixel circuit PCm is connected to the first organic light-emitting diode OLED to drive the first organic light-emitting diode OLED. The thin film transistor TFT of the second pixel circuit PCa may be connected to the second organic light-emitting diode OLED' to drive the second organic light-emitting diode OLED'. Because the thin film transistor TFT of the second pixel circuit PCa has a structure that is the same or substantially the same as (or similar to) that of the thin film transistor TFT of the first pixel circuit PCm, redundant description thereof may not be repeated.

The semiconductor layer AL is on the buffer layer 111, and may include polysilicon. In another embodiment, the semiconductor layer AL may include amorphous silicon. In another embodiment, the semiconductor layer AL may include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The semiconductor layer AL may include a source region and a drain region that are doped with impurities, and a channel region between the source region and the drain region.

The first gate insulating layer 112 may cover the semiconductor layer AL. The first gate insulating layer 112 may include an inorganic insulating material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). The first gate insulating layer 112 may have a single-layer structure or a multi-layered structure including one or more of the inorganic insulating materials.

The gate electrode GE is on the first gate insulating layer 112, so as to overlap with the channel region of the semiconductor layer AL. The gate electrode GE may include molybdenum (Mo), aluminum (Al), copper (Cu), titanium (Ti), and/or the like, and may have a single-layer structure or a multi-layered structure. As an example, the gate electrode GE may include a single layer including Mo.

The second gate insulating layer 113 may cover the gate electrode GE. The second gate insulating layer 113 may include an inorganic insulating material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). The second gate insulating layer 113 may have a single-layer structure or a multi-layered structure including one or more of the inorganic insulating materials.

An upper electrode CE2 of the capacitor Cst may be on the second gate insulating layer 113. The upper electrode CE2 of the capacitor Cst may overlap with the gate electrode GE thereunder. The gate electrode GE and the upper electrode CE overlapping with each other with the second gate insulating layer 113 therebetween may configure the capacitor Cst. The gate electrode GE may be a lower electrode CE1 of the capacitor Cst.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) in a single-layer structure or a multi-layered structure.

The interlayer insulating layer 115 may cover the upper electrode CE2. The interlayer insulating layer 115 may include an insulating material, for example, such as silicon oxide ($SiO_2$), silicon nitride (SiNx), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). The interlayer insulating layer 115 may have a single-layer structure or a multi-layered structure including one or more of the inorganic insulating materials.

The source electrode SE and the drain electrode DE may be on the interlayer insulating layer 115. The data line DL may be on the interlayer insulating layer 115. The data line DL may include the main data line DLm and the auxiliary data line DLa. The source electrode SE, the drain electrode DE, and the data line DL may each include a conductive material including molybdenum (Mo), aluminum (Al), copper (Cu), titanium (Ti), and/or the like, and may have a single-layer structure or a multi-layered structure including one or more of the above materials. For example, the source electrode SE, the drain electrode DE, and the data line DL may each have a multi-layered structure including Ti/Al/Ti. The source electrode SE and the drain electrode DE may be connected to the source region and the drain region, respectively, of the semiconductor layer AL via contact holes formed in the inorganic insulating layer K. In an embodiment, the source region and the drain region of the semiconductor layer AL may be included as parts of the source electrode SE and the drain electrode DE, respectively, of the thin film transistor TFT.

The inorganic insulating layer IIL of the display panel 10 may include a hole corresponding to the component area CA. For example, when the first gate insulating layer 112, the second gate insulating layer 113, and the interlayer insulating layer 115 are collectively referred to as the inorganic insulating layer IIL, the inorganic insulating layer IIL may include a first hole H1 corresponding to the component area CA. The first hole H1 may partially expose an upper surface of the buffer layer 111, or an upper surface of the substrate 100. The first hole H1 may be formed by overlapping an opening of the first interlayer insulating layer 112, an opening of the second gate insulating layer 113, and an opening of the interlayer insulating layer 115 with one another, where the openings correspond to (e.g., are at) the component area CA. The openings may be separately formed through separate processes, or may be concurrently (e.g., simultaneously) formed through the same process.

When the openings are separately formed through separate processes, an internal surface of the first hole H1 may not be smoothly formed, and may have steps.

The planarization layer 117 may cover the source electrode SE, the drain electrode DE, and the data line DL. The planarization layer 117 may have a flat or substantially flat upper surface, so that a first pixel electrode 121 and a second pixel electrode 121' that will be arranged thereon may be planarized or substantially planarized.

The planarization layer 117 may include an organic material or an inorganic material, and may have a single-layer structure or a multi-layered structure. In an embodiment, the planarization layer 117 may include a first planarization layer 117a that is a first organic insulating layer, and a second planarization layer 117b that is a second organic insulating layer. Accordingly, a conductive pattern, for example, such as a wiring, may be provided between the first planarization layer 117a and the second planarization layer 117b, and high integration may be implemented.

The first planarization layer 117a and the second planarization layer 117b may each have a siloxane-based organic material having high light transmittance and high flatness. The siloxane-based organic material may include hexamethyldisiloxane, octamethyltrisiloxane, decamethyltetrasiloxane, dodecamethylpentasiloxane, and/or polydimethylsiloxanes. As another example, the first and second planarization layers 117a and 117b may each include a general universal polymer (e.g., benzocyclobutene (BCB), polyimide, hexamethyldisiloxane (HMDSO), polymethylmethacrylate (PMMA), or polystyrene (PS)), polymer derivatives having phenol groups, an acryl-based polymer, an imide-based polymer, an aryl ether-based polymer, an amide-based polymer, a fluoride-based polymer, a p-xylene-based polymer, or a vinyl alcohol-based polymer. As another example, the first planarization layer 117a and the second planarization layer 117b may each include a photosensitive polyimide (PSPI), polycarbonate (PC), and/or the like.

In an embodiment, an organic insulating layer may be on the connecting line TWL, and a difference between a refractive index of the organic insulating layer and the refractive index of the connecting line TWL may be small (e.g., may be negligible). For example, the first planarization layer 117a may include the siloxane-based organic material, and the second planarization layer 117b may include the photosensitive polyimide.

The first planarization layer 117a may cover the first and second pixel circuits PCm and PCa at (e.g., in or on) the main display area MDA and the peripheral area DPA. The first planarization layer 117a may fill the first hole H1 of the inorganic insulating layer IIL, and may be on the buffer layer 111 at (e.g., in or on) the component area CA. The second planarization layer 117b may be on the first planarization layer 117a, and may have a flat or substantially flat upper surface such that the first and second pixel electrodes 121 and 121' may be formed to be flat or substantially flat.

The connecting electrode CM, the connecting line TWL, and the data connecting line DWL may be on the first planarization layer 117a.

The connecting line TWL may be at (e.g., in or on) the component area CA, and may be connected to the second organic light-emitting diode OLED'. The connecting line TWL may be connected to the additional connecting line TWL' (e.g., see FIG. 5) at (e.g., in or on) the peripheral area DPA. The additional connecting line TWL' may be connected to the second pixel circuit PCa, for example, to the thin film transistor TFT. In an embodiment, the additional connecting line TWL' may be at the same layer as that of the connecting line TWL, for example, on the first planarization layer 117a, and may include a different material from that of the connecting line TWL. In this case, the connecting line TWL may be directly in contact with, and connected to, the additional connecting line TWL'. In another embodiment, the additional connecting line TWL' may be at the same layer as that of the data line DL, for example, on the interlayer insulating layer 115, and may include the same material as that of the data line DL. In this case, the connecting line TWL may be connected to the additional connecting line TWL' via a contact hole.

The connecting line TWL may include a transparent conductive material. For example, the connecting line TWL may include a transparent conducting oxide (TCO). The connecting line TWL may include a conductive oxide, for example, such as indium tin oxide (ITO), indium zinc oxide (IZO), zinc oxide (ZnO), indium oxide ($In_2O_3$), indium gallium oxide, or aluminum zinc oxide (AZO). The connecting line TWL may include a transparent conductive oxide having a transmittance of 50% or greater.

The additional connecting line TWL' may have a higher conductivity than that of the connecting line TWL. Because the additional connecting line TWL' is at (e.g., in or on) the peripheral area DPA, there may be no need to ensure light transmittance thereof. Thus, the additional connecting line TWL' may include a material having a lower light transmittance and a higher conductivity than those of the connecting line TWL. The additional connecting line TWL' may include a conductive material including molybdenum (Mo), aluminum (Al), copper (Cu), titanium (Ti), and/or the like, and may have a single-layer structure or a multi-layered structure.

The first and second organic light-emitting diodes OLED and OLED' are on the second planarization layer 117b. The first pixel electrode 121 of the first organic light-emitting diode OLED may be connected to the first pixel circuit PCm via the connecting electrode CM on the first planarization layer 117a. The second pixel electrode 121' of the second organic light-emitting diode OLED' may be connected to the second pixel circuit PCa via the connecting line TWL on the first planarization layer 117a. The first planarization layer 117a and the second planarization layer 117b may be stacked on one another between the substrate 100 and the second pixel electrode 121' at (e.g., in or on) the component area CA.

The first pixel electrode 121 and the second pixel electrode 121' may include a conductive oxide, for example, such as indium tin oxide (ITO), indium zinc oxide (IZO), zinc oxide (ZnO), indium oxide ($In_2O_3$), indium gallium oxide, or aluminum zinc oxide (AZO). The first and second pixel electrodes 121 and 121' may each include a reflective layer including argentum (Ag), magnesium (Mg), aluminum (Al), platinum (Pt), palladium (Pd), aurum (Au), nickel (Ni), neodymium (Nd), iridium (Ir), chrome (Cr), or a compound thereof. For example, the first and second pixel electrodes 121 and 121' may each have a structure in which films including ITO, IZO, ZnO, or $In_2O_3$ are on and/or under the above-mentioned reflective layer. In this case, the first and second pixel electrodes 121 and 121' may each have a stacked structure including ITO/Ag/ITO.

The opaque layer SHL may be on the second planarization layer 117b at (e.g., in or on) the component area CA. The opaque layer SHL is an insulating pattern between the second pixel electrode 121' and the substrate 100, so as to correspond to the second pixel electrode 121', and may be a floating layer. The opaque layer SHL may correspond to at least a region of the second pixel electrode 121', which is exposed by the pixel defining layer 119.

The opaque layer SHL may include an organic material or an inorganic material having an optical density (OD) of 1 or greater, and may have a single-layer structure or a multi-layered structure. In an embodiment, the opaque layer SHL may include an opaque insulating material, for example, such as carbon, carbon black, diamond-like carbon, black acryl, black matrix, and/or the like. In another embodiment, the opaque layer SHL may include a colored pigment, for example, such as a black colored pigment or another colored pigment. For example, the opaque layer SHL may include a polyimide (PI)-based binder, and a pigment in which red, green, and blue colors are mixed with each other. As another example, the opaque layer SHL may include a cardo-based binder resin, and a mixture of a lactam black pigment and a blue pigment. In another embodiment, the opaque layer SHL may include molybdenum (Mo)/molybdenum oxide (MoOx).

The opaque layer SHL may have a light reflectivity of 5.5% or less. The opaque layer SHL may have a thickness of about 0.2 micrometers (μm) or greater.

As shown in FIG. 7, the opaque layer SHL may have a size that is smaller than that of the second pixel electrode 121'. For example, a distance D between an edge of the opaque layer SHL and an edge of the second pixel electrode 121' may be less than or equal to 4 μm. For example, when the second pixel electrode 121' has a size of 12 μm×12 μm, the opaque layer SHL may have a size of 8 μm×8 μm or greater. The opaque layer SHL may have a shape corresponding to that of the second pixel electrode 121'.

The opaque layer SHL may be between the second planarization layer 117b and the second pixel electrode 121'. An upper surface of the opaque layer SHL is in contact with a lower surface of the second pixel electrode 121', and a lower surface of the opaque layer SHL may be in contact with an upper surface of the second planarization layer 117b.

In FIG. 7, the second pixel electrode 121' and the opaque layer SHL are shown as having square shapes, but the present disclosure is not limited thereto. For example, the second pixel electrode 121' and the opaque layer SHL may have circular shapes or polygonal shapes that are similar to the circular shapes.

As shown in FIG. 8A, the connecting line TWL may be between the substrate 100 and the second planarization layer 117b, or in more detail, between the first planarization layer 117a and the second planarization layer 117b.

The connecting line TWL may be on the first planarization layer 117a, and the second planarization layer 117b may be on the connecting line TWL. A contact hole CH partially exposing the connecting line TWL may be formed in the second planarization layer 117b. The second planarization layer 117b may also include a contact hole partially exposing the connecting electrode CM at (e.g., in or on) the main display area MDA.

As shown in FIG. 8B, the opaque layer SHL may be on the second planarization layer 117b at a location corresponding to the second pixel electrode 121', and may have a pattern that is similar to that of the second pixel electrode 121'. The opaque layer SHL may not overlap with the contact hole CH of the second planarization layer 117b.

As shown in FIG. 8C, the opaque layer SHL may be between the second planarization layer 117b and the second pixel electrode 121'.

The second pixel electrode 121' is on the opaque layer SHL, and may be connected to the connecting line TWL via the contact hole CH. The first pixel electrode 121 is on the second planarization layer 117b at (e.g., in or on) the main display area MDA, and may be connected to the connecting electrode CM via the contact hole.

Referring again to FIG. 6A, the pixel defining layer 119 is on the planarization layer 117, and covers edges of the first and second pixel electrodes 121 and 121'. The pixel defining layer 119 may have a first opening OP1 and a second opening OP2 exposing some portions of the first and second pixel electrodes 121 and 121', respectively. The first opening OP1 and the second opening OP2 may not overlap with the location of the contact hole that connects the first pixel electrode 121 to the connecting electrode CM and the location of the contact hole CH that connects the second pixel electrode 121' to the connecting line TWL. In other words, the pixel defining layer 119 may overlap with the contact hole connecting the first pixel electrode 121 to the connecting electrode CM and the contact hole CH connecting the second pixel electrode 121' to the connecting line TWL, and may cover the contact hole and the contact hole CH. The sizes and shapes of light-emitting regions of the first and second organic light-emitting diodes OLED and OLED', or in other words, the first and second sub-pixels Pm and Pa, are defined by the first opening OP1 and the second opening OP2.

The pixel defining layer 119 may prevent or substantially prevent the generation of an arc at the edges of the first and second pixel electrodes 121 and 121' by increasing the distance between the edges of the first and second pixel electrodes 121 and 121' and the opposite electrode 123 on the first and second pixel electrodes 121 and 121'. The pixel defining layer 119 may include an organic insulating material, for example, such as polyimide, polyamide, acrylic resin, benzocyclobutene, hexamethyldisiloxane (HMDSO), and/or phenolic resin, and may be formed by spin coating.

A first emission layer 122b and a second emission layer 122b' corresponding to the first pixel electrode 121 and the second pixel electrode 121' are in the first opening OP1 and the second opening OP2, respectively, of the pixel defining layer 119. The first emission layer 122b and the second emission layer 122b' may include a polymer material or a low-molecular material, and may emit a red light, a green light, a blue light, or a white light.

A functional layer 122e may be on and/or under the first and second emission layers 122b and 122b'. The functional layer 122e may include a first functional layer 122a and/or a second functional layer 122c. The first functional layer 122a or the second functional layer 122c may be omitted as needed or desired.

The first functional layer 122a may be under (e.g., underneath) the first emission layer 122b and the second emission layer 122b'. The first functional layer 122a may have a single-layer structure or a multi-layered structure including an organic material. For example, the first functional layer 122a may include a hole transport layer (HTL) having a single-layer structure. As another example, the first functional layer 122a may include a hole injection layer (HIL) and the HTL. The first functional layer 122a may be integrally provided to correspond to the first and second organic light-emitting diodes OLED and OLED' at (e.g., in or on) the main display area MDA and the component area CA.

The second functional layer 122c may be on the first emission layer 122b and the second emission layer 122b'. The second functional layer 122c may have a single-layer structure or a multi-layered structure including an organic material. The second functional layer 122c may include an electron transport layer (ETL) and/or an electron injection layer (EIL). The second functional layer 122c may be integrally provided to correspond to the first and second organic light-emitting diodes OLED and OLED' at (e.g., in or on) the main display area MDA and the component area CA.

The opposite electrode 123 is on the second functional layer 122c. The opposite electrode 123 may include a conductive material having a low work function. For example, the opposite electrode 123 may include a transparent or semi-transparent transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. As another example, the opposite electrode 123 may further include a layer including ITO, IZO, ZnO, or $In_2O_3$ on the transparent or semi-transparent layer including one or more of the above materials. The opposite electrode 123 may be integrally provided to correspond to the first and second organic light-emitting diodes OLED and OLED' at (e.g., in or on) the main display area MDA and the component area CA.

The layers from the first pixel electrode 121 to the opposite electrode 123 at (e.g., in or on) the main display area MDA may configure the first organic light-emitting diode OLED. The layers from the second pixel electrode 121' to the opposite electrode 123 at (e.g., in or on) the component area CA may configure the second organic light-emitting diode OLED'.

An upper layer 150 including an organic material may be on the opposite electrode 123. The upper layer 150 may be provided to protect the opposite electrode 123, and to improve light extraction efficiency. The upper layer 150 may include an organic material having a higher refractive index than that of the opposite electrode 123. As another example, the upper layer 150 may include stacked layers having different refractive indices from one another. For example, the upper layer 150 may include a high refractive index layer/low refractive index layer/high refractive index layer. The high refractive index layer may have a refractive index of 1.7 or greater, and the low refractive index layer may have a refractive index of 1.3 or less.

The upper layer 150 may additionally include LiF. As another example, the upper layer 150 may additionally include an inorganic insulating material, for example, such as silicon oxide ($SiO_2$) and/or silicon nitride (SiNx).

The connecting line TWL is shown as being on the first planarization layer 117a in FIG. 6A, but in another embodiment, the connecting line TWL may be in the first hole H1 as shown in FIG. 6B. For example, the connecting line TWL may be on the buffer layer 111 at (e.g., in or on) the component area CA.

Referring to FIG. 6B, the connecting line TWL may be between the substrate 100 and the first planarization layer 117a, or between the buffer layer 111 and the first planarization layer 117a. The connecting line TWL may be connected to a connecting electrode CM' on the first planarization layer 117a via a contact hole, and may be connected to the second pixel electrode 121' via the connecting electrode CM'. The connecting line TWL is connected to the additional connecting line TWL' at (e.g., in or on) the peripheral area DPA via a contact hole, and may be connected to the second pixel circuit PCa via the additional connecting line TWL'. In this case, the first planarization layer 117a above (e.g., directly on) the connecting line TWL may include a photosensitive polyimide, and the second planarization layer 117b may include a siloxane-based organic material.

Figure 9:
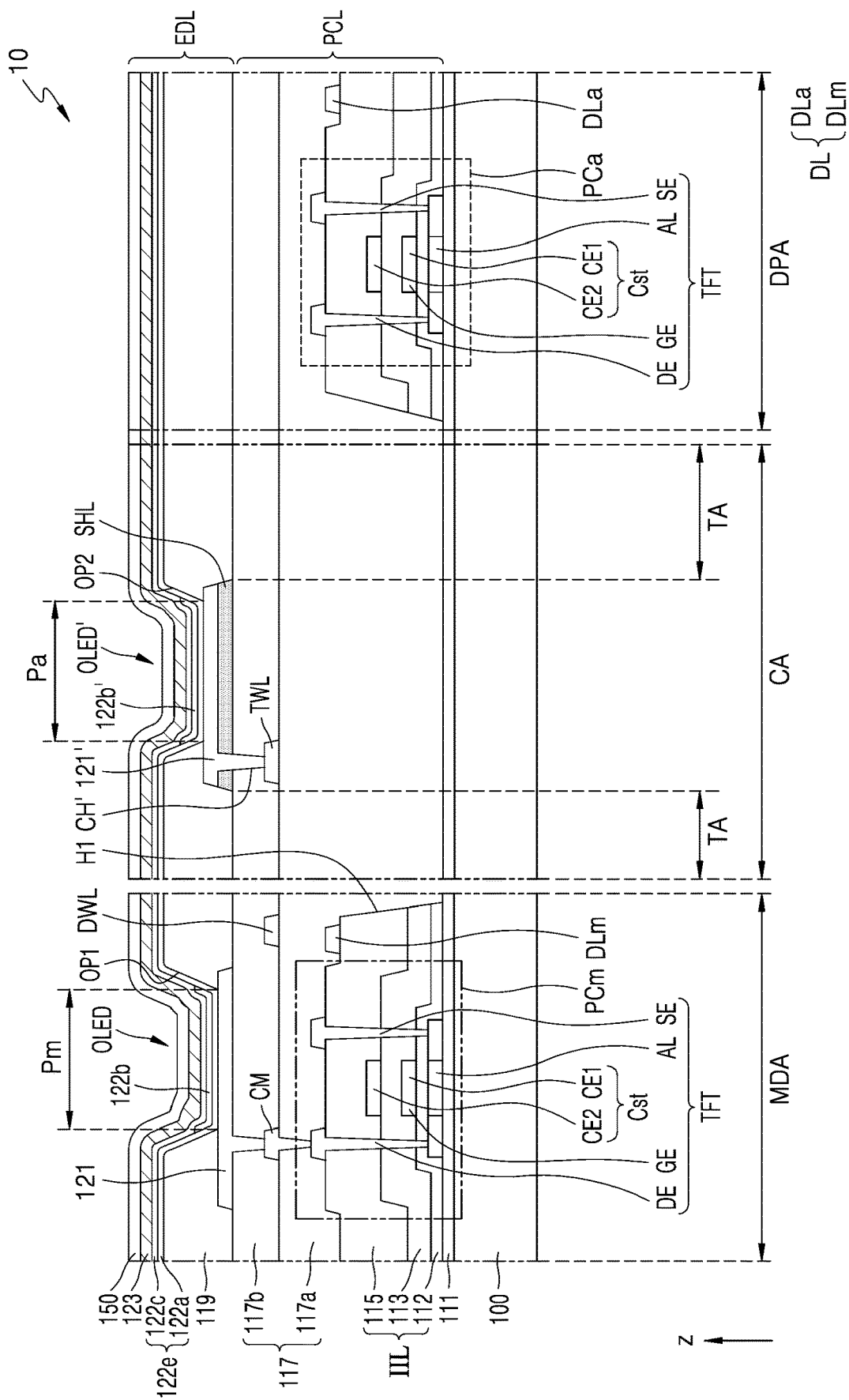
FIG. 9 is a cross-sectional view partially showing a display panel according to an embodiment.
Figure 10:
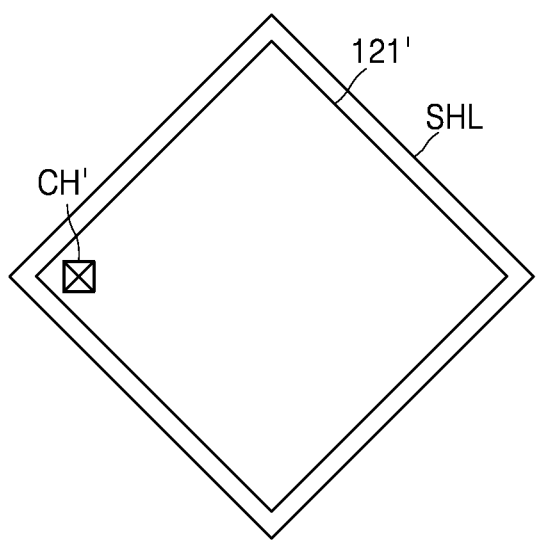
FIG. 10 is a plan view of a second pixel electrode and an opaque layer according to the embodiment of FIG. 9.
Figure 11A:
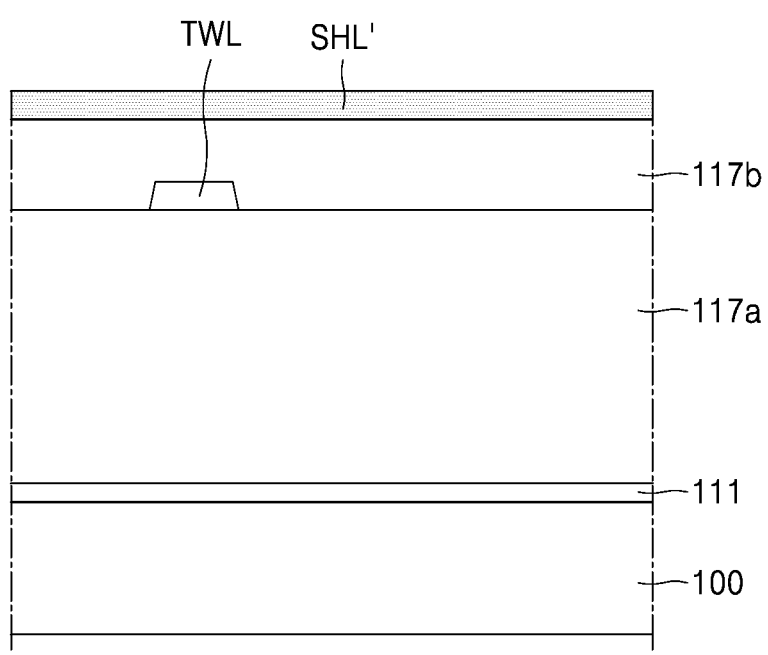
FIGS. 11A-11C are cross-sectional views illustrating various processes of forming the second pixel electrode and the opaque layer according to the embodiment of FIG. 9.
Figure 11B:
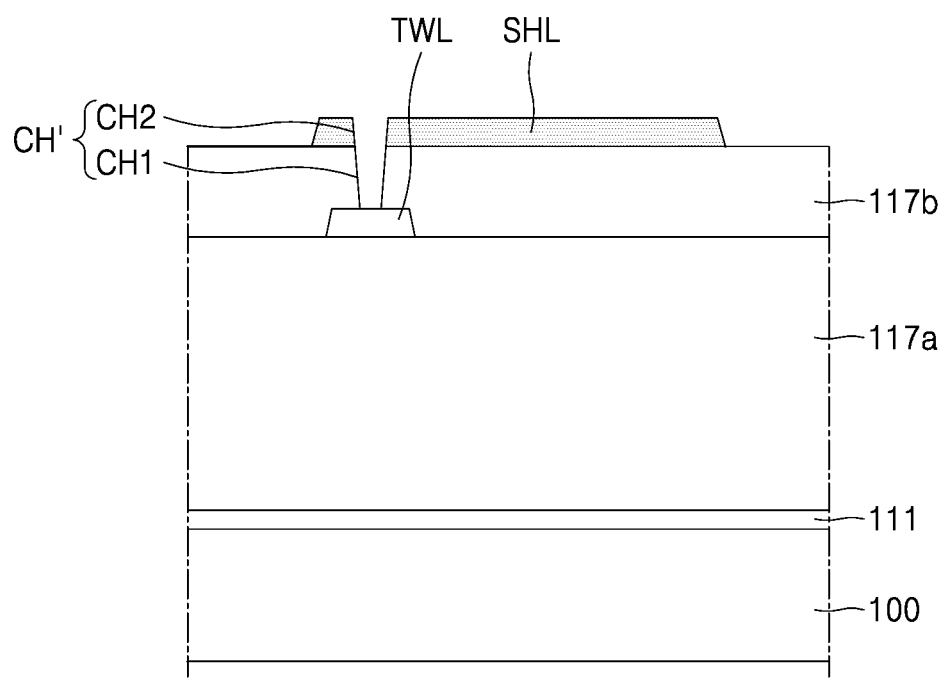
Figure 11C:
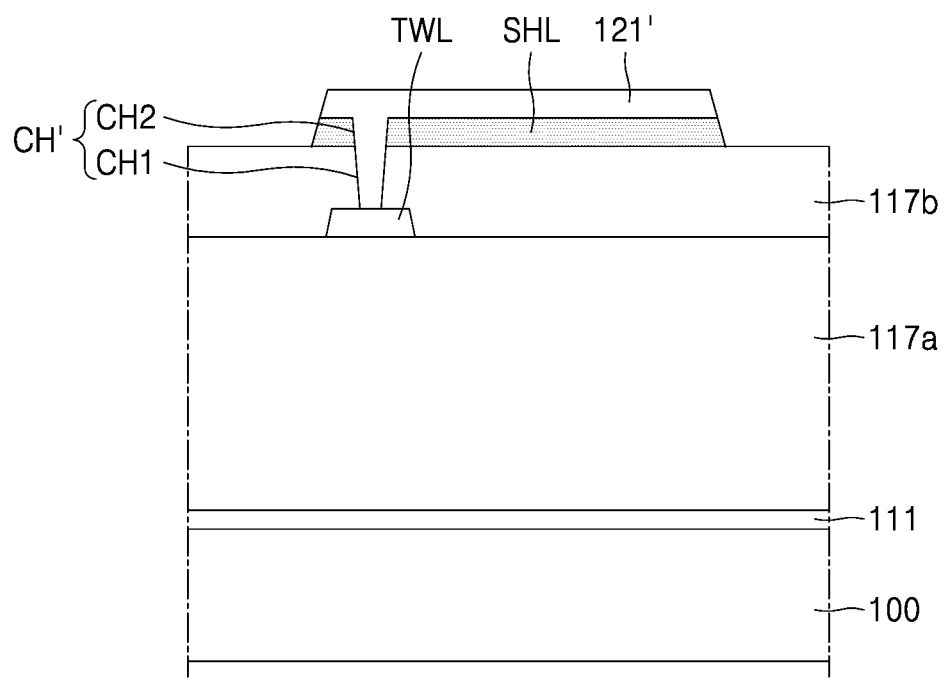

FIG. 9 is a cross-sectional view partially showing the display panel 10 according to an embodiment. FIG. 10 is a plan view of the second pixel electrode 121' and the opaque layer SH according to the embodiment of FIG. 9. FIGS. 11A to 11C are cross-sectional views illustrating various processes of forming the second pixel electrode 121' and the opaque layer SH according to the embodiment of FIG. 9. In FIG. 9, like reference symbols as those of FIG. 6A denote the same or substantially the same elements, members, and layers, and thus, redundant description thereof may not be repeated.

Referring to FIG. 9, the opaque layer SHL may be on the second planarization layer 117b at (e.g., in or on) the component area CA. As shown in FIG. 10, the opaque layer SHL may have a size that is greater than that of the second pixel electrode 121'.

As shown in FIG. 11A, the connecting line TWL is on the first planarization layer 117a, and the second planarization layer 117b is on the connecting line TWL. An organic insulating layer SHL' including an opaque organic material may be on the second planarization layer 117b.

As shown in FIG. 11B, a contact hole CH' partially exposing the connecting line TWL may be in (e.g., may penetrate) the second planarization layer 117b and the organic insulating layer SHL'. The second planarization layer 117b may further include a contact hole partially exposing the connecting electrode CM at (e.g., in or on) the main display area MDA. The contact hole CH1 in the second planarization layer 117b and the contact hole CH2 in the organic insulating layer SHL' may overlap with each other. When the contact hole CH2 is formed in the organic insulating layer SHL', the organic insulating layer SHL' may be patterned to form the opaque layer SHL. The opaque layer SHL may be formed as a pattern having a shape that is similar to that of the second pixel electrode 121' in the location corresponding to the second pixel electrode 121'.

As shown in FIG. 11C, the second pixel electrode 121' may be on the opaque layer SHL, and may be connected to the connecting line TWL via the contact hole CH'. The first pixel electrode 121 is on the second planarization layer 117b, and may be connected to the connecting electrode CM via the contact hole at (e.g., in or on) the main display area MDA.

In the embodiment of FIG. 9, the connecting line TWL is shown as being on the first planarization layer 117a, but as shown in FIG. 6B, the connecting line TWL may be in the first hole H1, or in other words, on the buffer layer 111, and may be connected to the connecting electrode CM' on the first planarization layer 117a.

Figure 12:
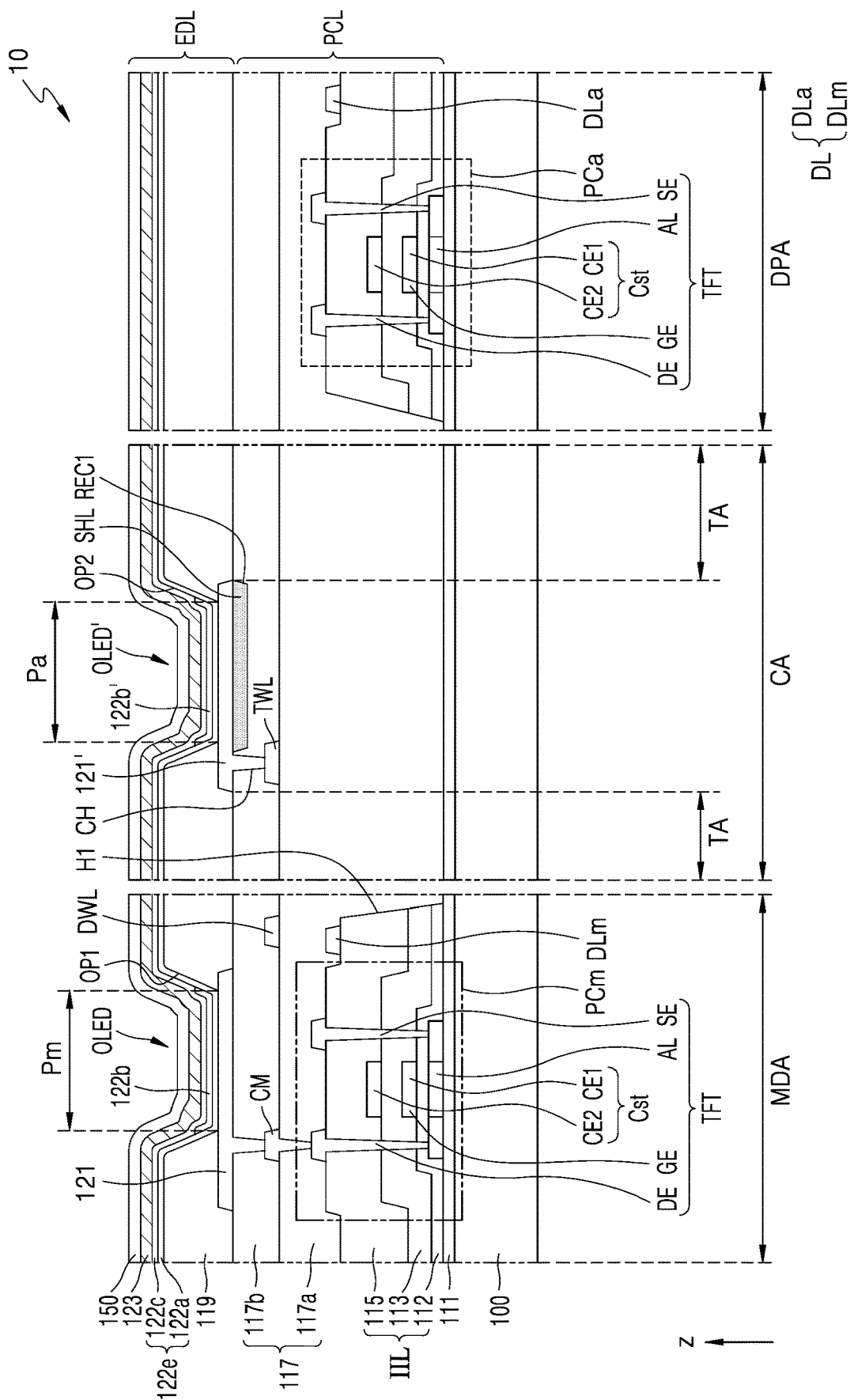
FIG. 12 is a cross-sectional view showing some portions of a display panel according to an embodiment.
Figure 13A:
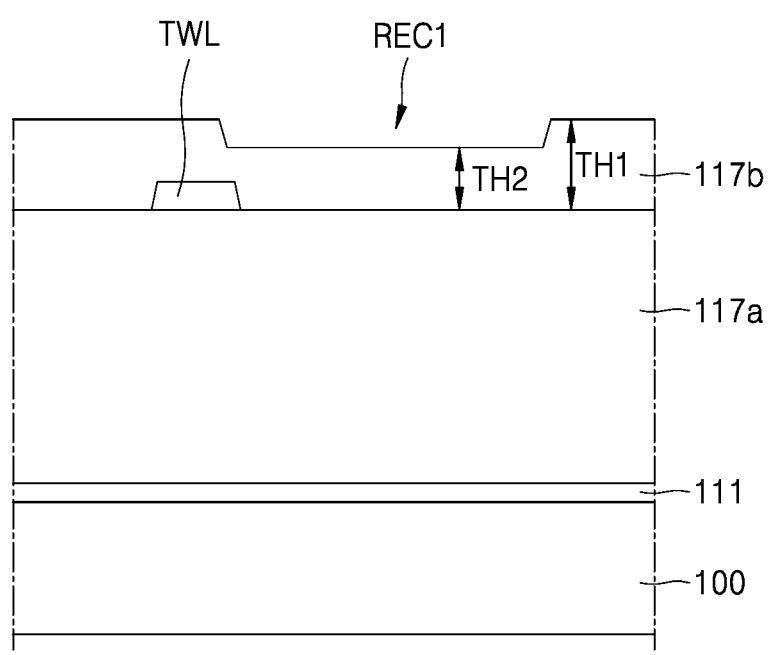
FIGS. 13A-13D are cross-sectional views illustrating various processes of forming the second pixel electrode and the opaque layer according to the embodiment of FIG. 12.
Figure 13B:
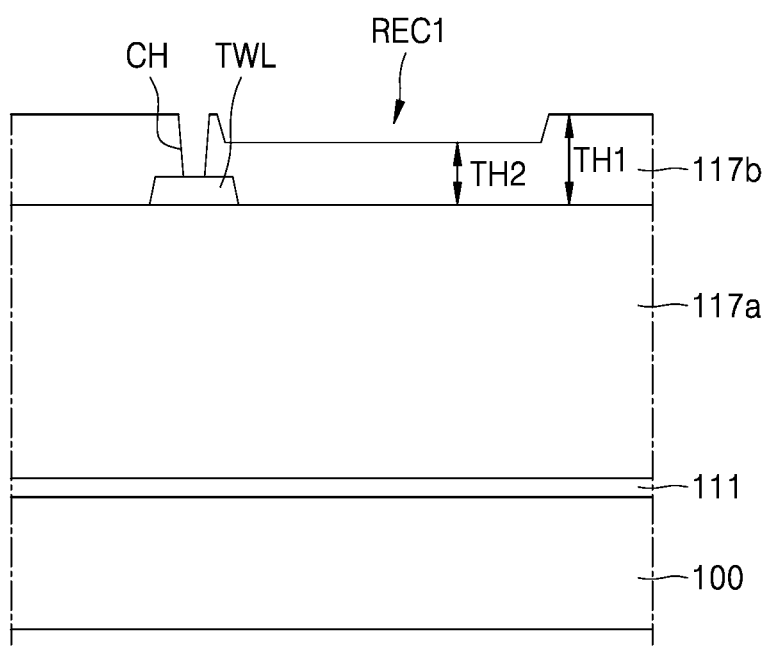
Figure 13C:
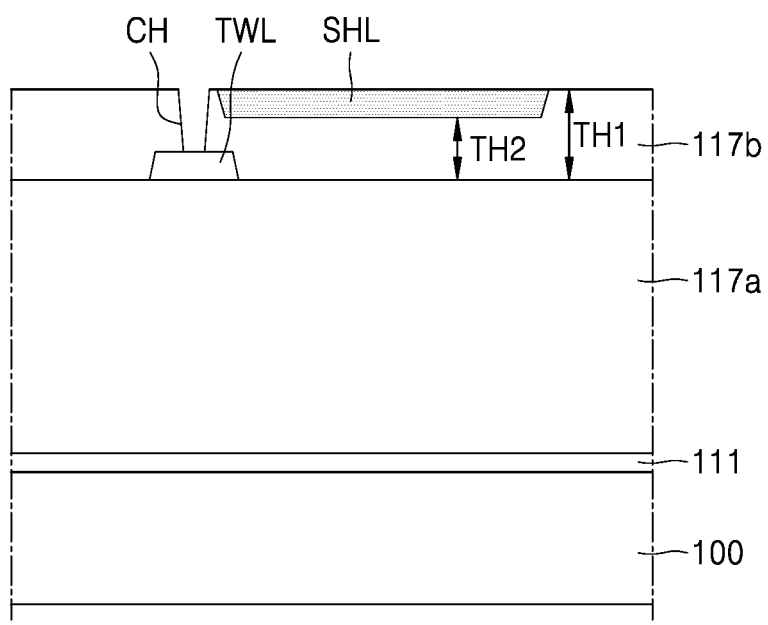
Figure 14:
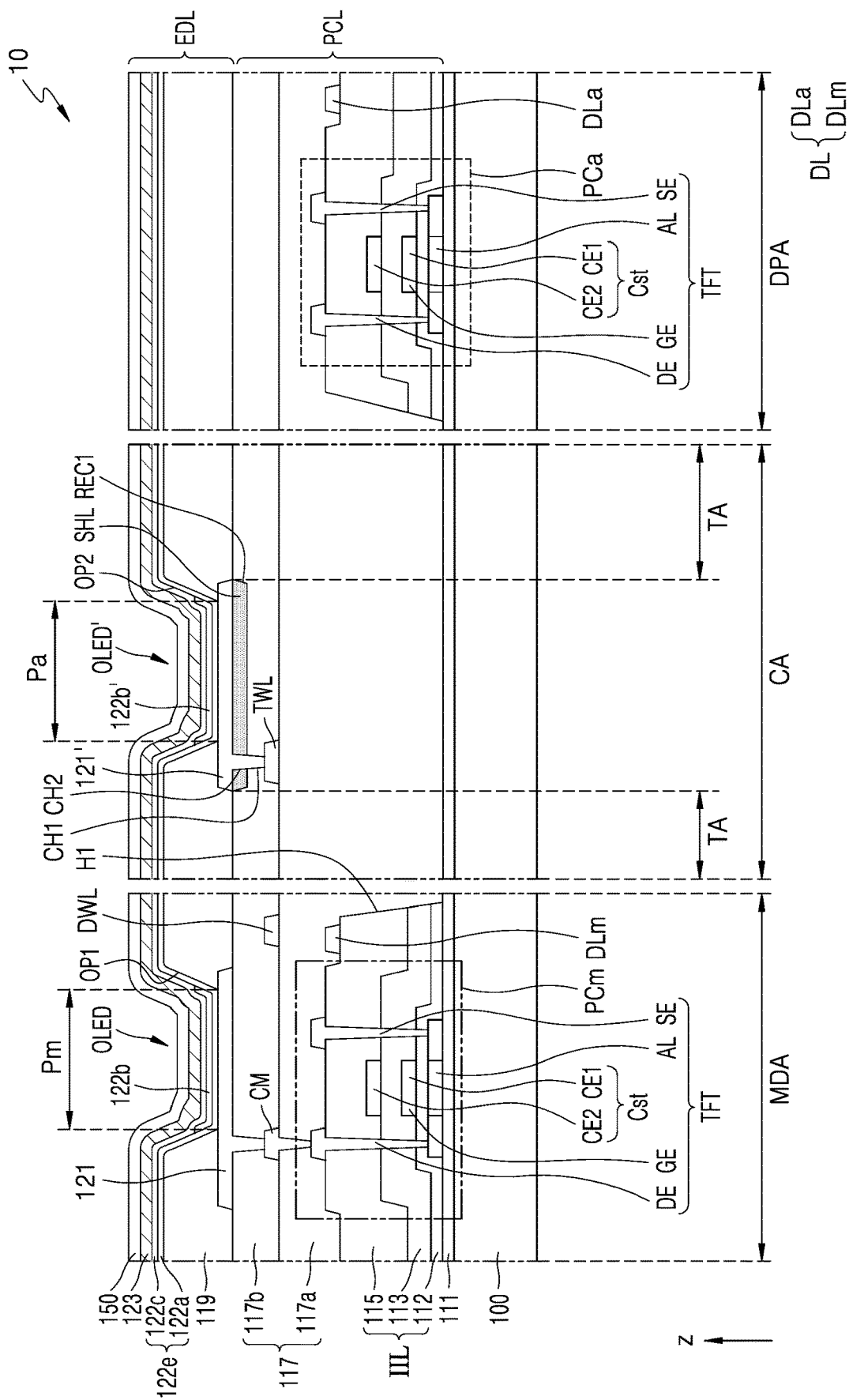
FIG. 14 is a cross-sectional view showing some portions of a display panel according to an embodiment.

FIGS. 12 and 14 are cross-sectional views showing some portions of the display panel 10 according to one or more embodiments. FIGS. 13A to 13C are cross-sectional views illustrating various processes of forming the second pixel electrode 121' and the opaque layer SHL according to the embodiment of FIG. 12. In FIGS. 12 and 14, like reference symbols denote the same or substantially the same elements, members, and layers as those of FIG. 6A, and thus, redundant description thereof may not be repeated.

Referring to FIG. 12, the opaque layer SHL may be on the second planarization layer 117b at (e.g., in or on) the component area CA. In other words, the opaque layer SHL may be between the second planarization layer 117b and the second pixel electrode 121'. The second planarization layer 117b includes a recess REC1 accommodating the opaque layer SHL in a location corresponding to the second pixel electrode 121', and the opaque layer SHL may be in the recess REC1 of the second planarization layer 117b. The second pixel electrode 121' is on the opaque layer SHL, and may be connected to the connecting line TWL on the first planarization layer 117a via the contact hole CH.

As shown in FIG. 13A, the connecting line TWL may be between the first planarization layer 117a and the second planarization layer 117b.

The connecting line TWL may be on the first planarization layer 117a, and the second planarization layer 117b may be on the connecting line TWL. The second planarization layer 117b may include the recess REC1 in the location corresponding to the second pixel electrode 121'. By forming the recess REC1 in the second planarization layer 117b by using a half-tone mask, the second planarization layer 117b may include regions having different thicknesses from each other, or in other words, a region having a first thickness TH1, and a region having a second thickness TH2 that is less than the first thickness TH1. The recess REC1 may have a shape that is similar to that of the second pixel electrode 121' in the location corresponding to the second pixel electrode 121'.

As shown in FIG. 13B, the contact hole CH partially exposing the connecting line TWL may be in the second planarization layer 117b. The second planarization layer 117b may further include a contact hole partially exposing the connecting electrode CM at (e.g., in or on) the main display area MDA.

As shown in FIG. 13C, a light-shielding organic material is filled in the recess REC1 of the second planarization layer 117b to form the opaque layer SHL. An upper surface of the opaque layer SHL and an upper surface of the region having the first thickness TH1 in the second planarization layer 117b may coincide (e.g., may be co-planar) with each other.

Figure 13D:
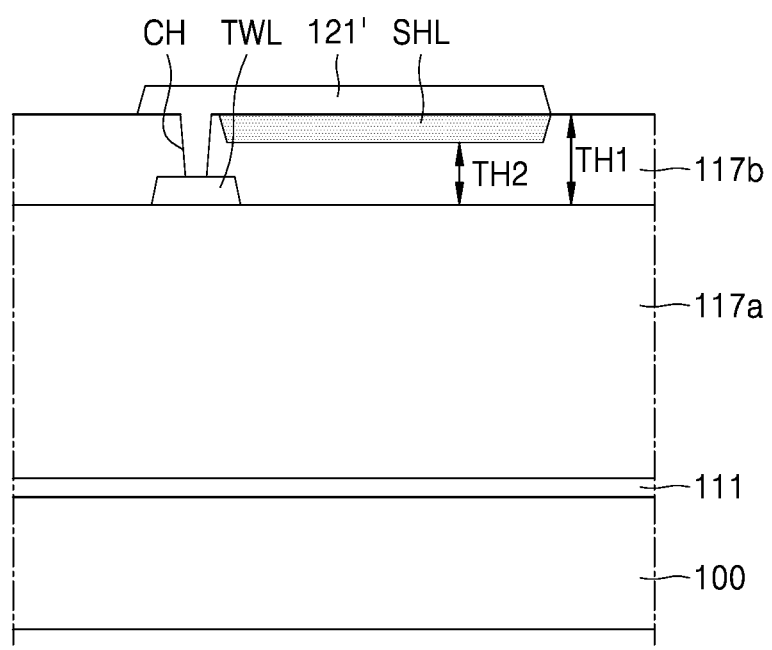

As shown in FIG. 13D, the second pixel electrode 121' is on the opaque layer SHL and the second planarization layer 117b, and may be connected to the connecting line TWL via the contact hole CH. The first pixel electrode 121 is on the second planarization layer 117b and may be connected to the connecting electrode CM via the contact hole at (e.g., in or on) the main display area MDA.

In the embodiment illustrated in FIG. 12, a size of the recess REC1 in the second planarization layer 117b and a size of the opaque layer SHL may be less than that of the second pixel electrode 121'. But in another embodiment, the size of the recess REC1 in the second planarization layer 117b and the size of the opaque layer SHL may be greater than or equal to that of the second pixel electrode 121' as shown in FIG. 14. In this case, the second pixel electrode 121' may be connected to the connecting line TWL via the contact hole CH1 in the second planarization layer 117b and the contact hole CH2 in the opaque layer SHL. The contact hole CH2 in the opaque layer SHL may overlap with the contact hole CH1 in the second planarization layer 117b.

In the embodiments shown in FIGS. 12 and 14, the connecting line TWL is on the first planarization layer 117a, but as shown in FIG. 6B, the connecting line TWL may be in the first hole H1, or in other words, between the buffer layer 111 and the first planarization layer 117a, and may be connected to the connecting electrode CM' on the first planarization layer 117a.

Figure 15:
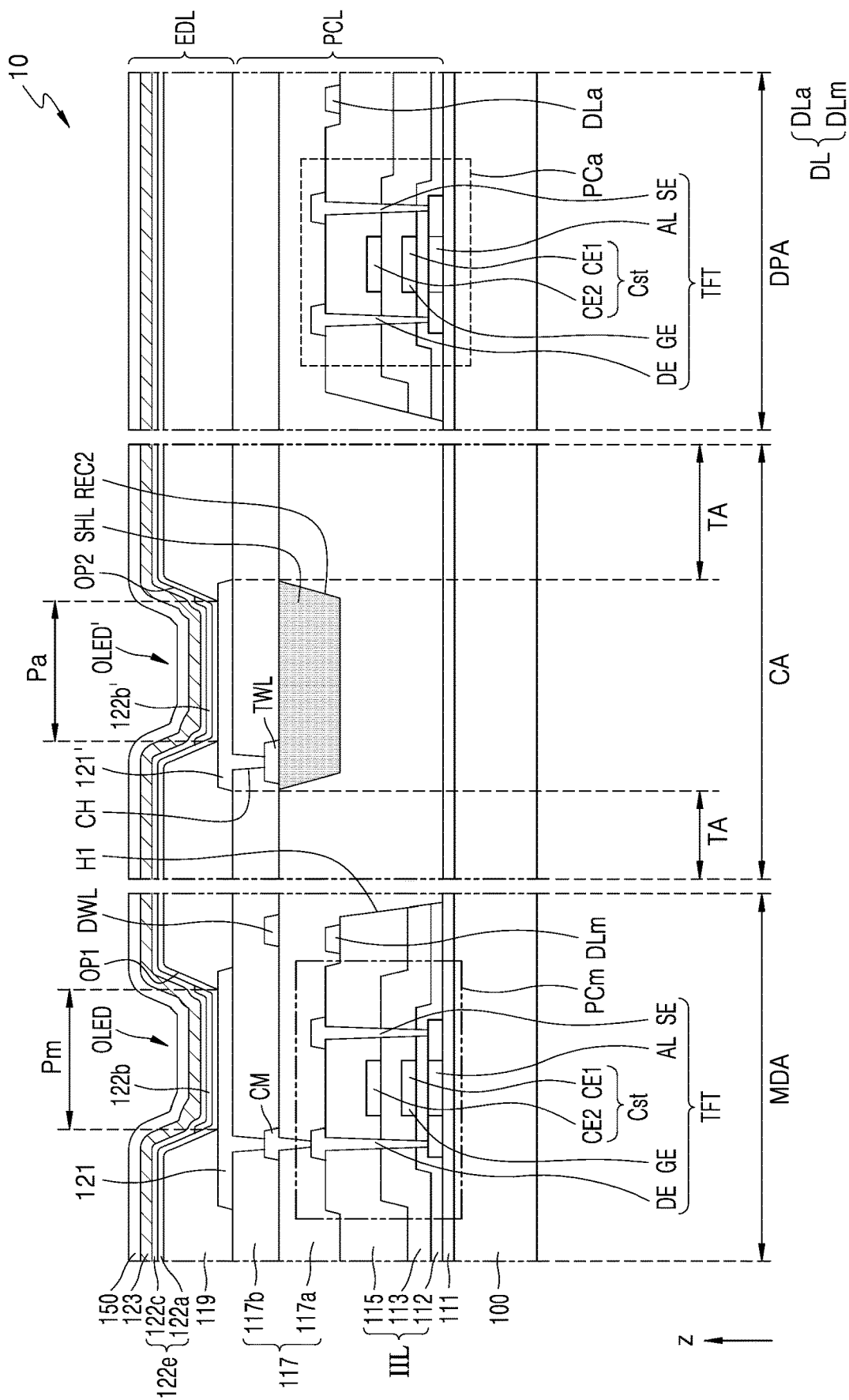
FIG. 15 is a cross-sectional view showing some portions of a display panel according to an embodiment.
Figure 16A:
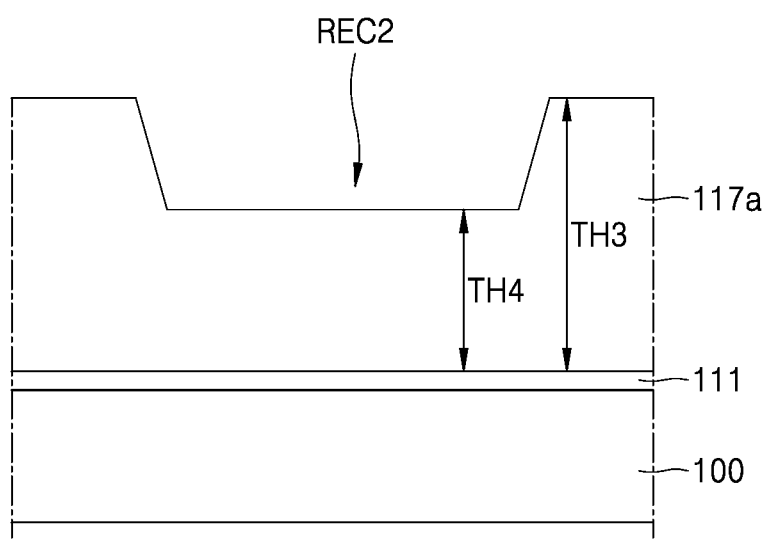
FIGS. 16A-16D are cross-sectional views illustrating various processes of forming the second pixel electrode and the opaque layer according to the embodiment of FIG. 15.
Figure 16B:
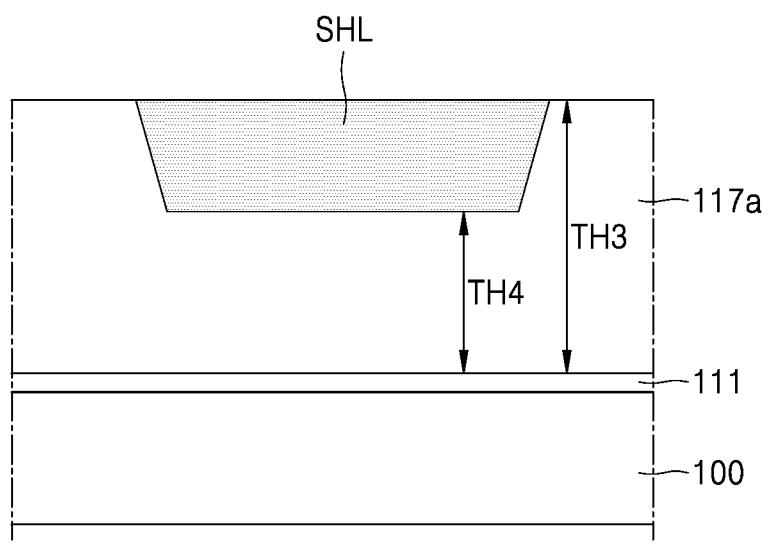
Figure 16C:
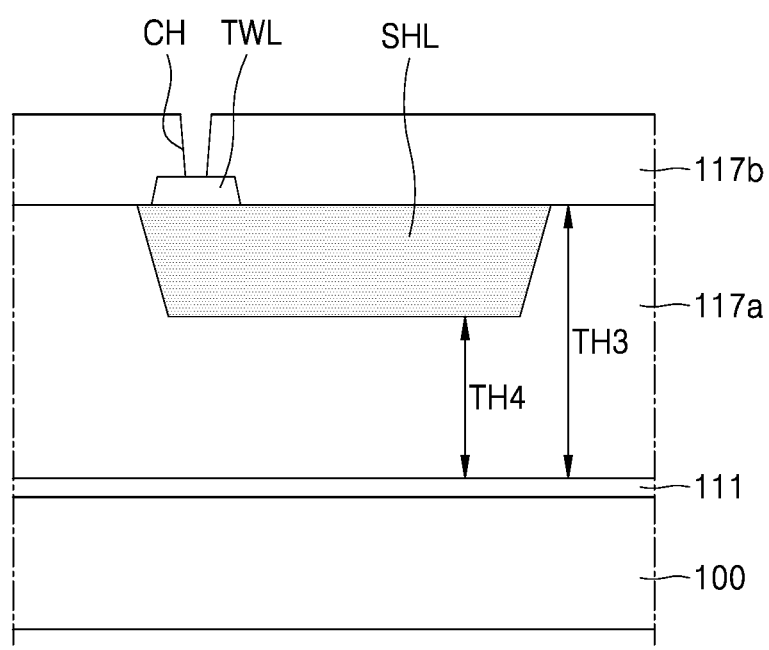
Figure 16D:
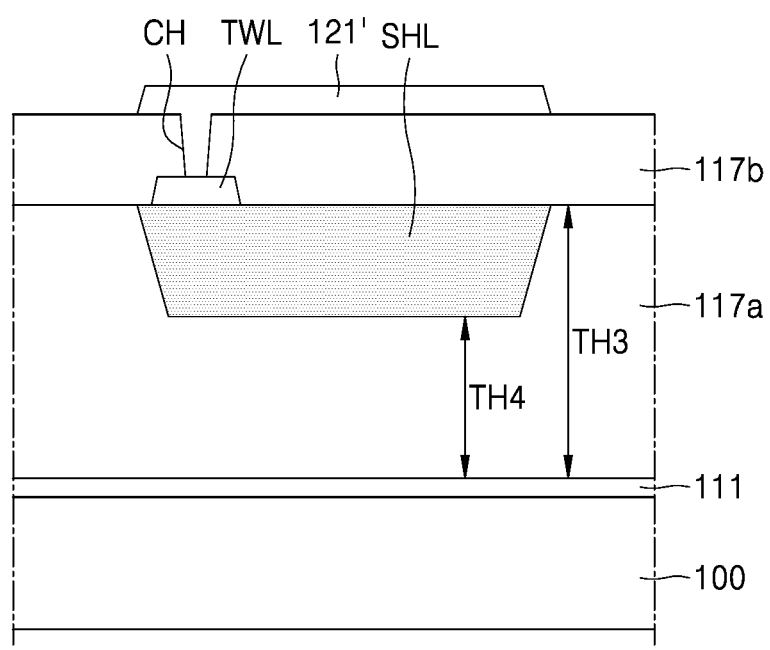
Figure 17:
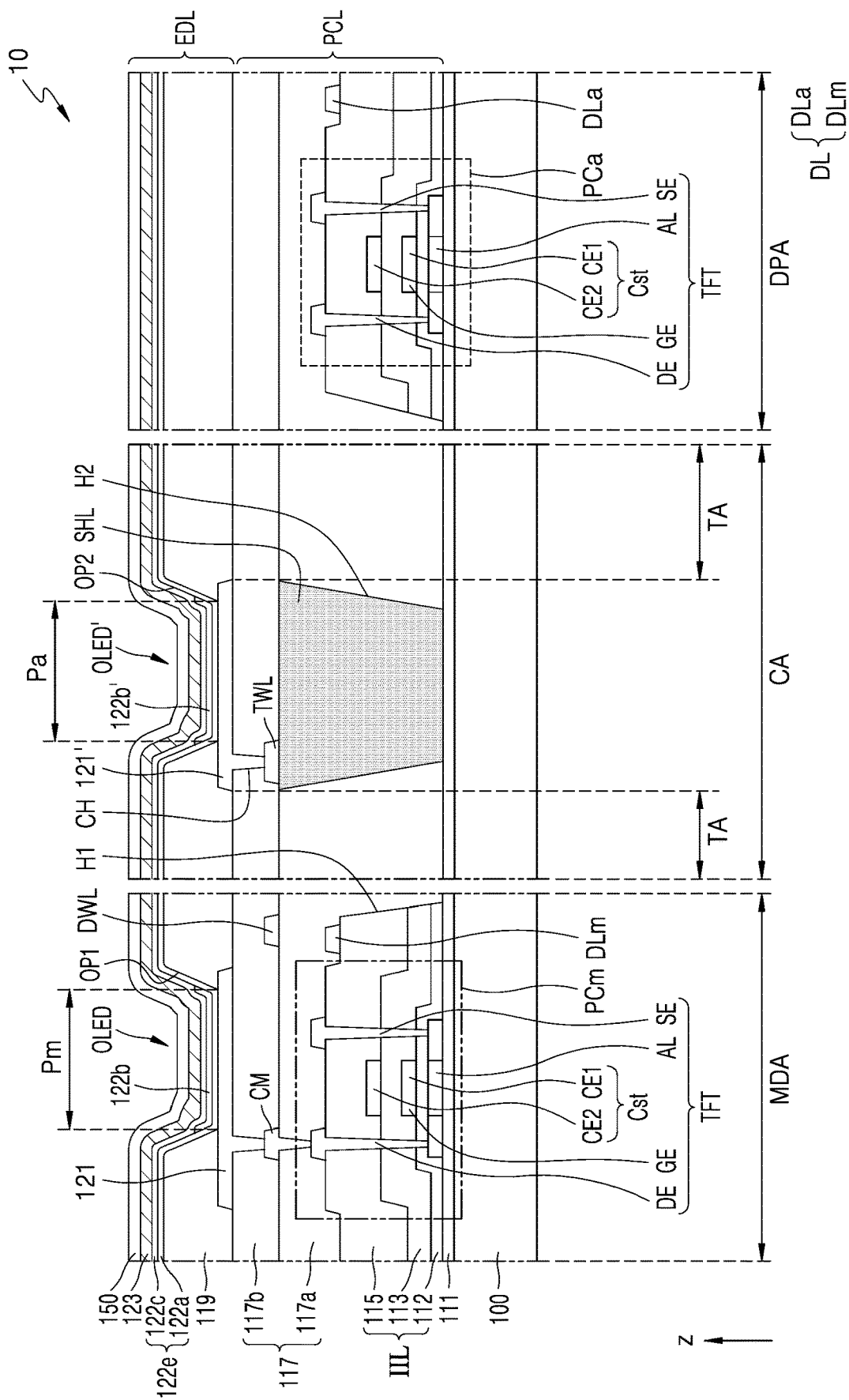
FIG. 17 is a cross-sectional view showing some portions of a display panel according to an embodiment.

FIGS. 15 and 17 are cross-sectional views showing some portions of the display panel 10 according to one or more embodiments. FIGS. 16A to 16D are cross-sectional views illustrating various processes of forming the second pixel electrode 121' and the opaque layer SHL according to the embodiment of FIG. 15. In FIGS. 15 and 17, like reference symbols denote the same members, elements, and layers as those of FIG. 6A, and thus, redundant description thereof may not be repeated.

Referring to FIG. 15, the opaque layer SHL may be on the first planarization layer 117a at (e.g., in or on) the component area CA. The opaque layer SHL may be between the first planarization layer 117a and the second planarization layer 117b. The first planarization layer 117a may include a recess REC2 for accommodating the opaque layer SHL, and the opaque layer SHL may be included in the recess REC2 of the first planarization layer 117a. The connecting line TWL may be on the opaque layer SHL, and the second planarization layer 117b may be on the connecting line TWL. A part of the connecting line TWL may be directly on the opaque layer SHL, and a remaining part of the connecting line TWL may be directly on the first planarization layer 117a. The second planarization layer 117b may cover the connecting line TWL, the opaque layer SHL, and the first planarization layer 117a. The second pixel electrode 121' may be on the second planarization layer 117b, and may be connected to the connecting line TWL via the contact hole CH. In the embodiment of FIG. 15, the opaque layer SHL may block or reduce light reflection from the second pixel electrode 121', and light reflection from the connecting line TWL.

As shown in FIG. 16A, the first planarization layer 117a may be on the buffer layer 111, and may include the recess REC2 in a location corresponding to the second pixel electrode 121'. By forming the recess REC2 in the first planarization layer 117a by using a half-tone mask, the first planarization layer 117a may include regions having different thicknesses from each other, or in other words, a region having a third thickness TH3, and a region having a fourth thickness TH4 that is less than the third thickness TH3. The recess REC2 may have a shape that is similar to that of the second pixel electrode 121' in the location corresponding to the second pixel electrode 121'.

As shown in FIG. 16B, a light-shielding organic material is filled in the recess REC2 of the first planarization layer 117a to form the opaque layer SHL. An upper surface of the opaque layer SHL and an upper surface of the region having the third thickness TH3 in the first planarization layer 117a may coincide (e.g., may be co-planar) with each other.

As shown in FIG. 16C, the connecting line TWL is on the opaque layer SHL, and the second planarization layer 117b is on the connecting line TWL. A contact hole CH partially exposing the connecting line TWL may be formed in the second planarization layer 117b. The second planarization layer 117b may further include a contact hole partially exposing the connecting electrode CM at (e.g., in or on) the main display area MDA.

As shown in FIG. 16D, the second pixel electrode 121' is on the second planarization layer 117b, and may be connected to the connecting line TWL via the contact hole CH. The first pixel electrode 121 is on the second planarization layer 117b, and may be connected to the connecting electrode CM via the contact hole at (e.g., in or on) the main display area MDA.

In another embodiment, as shown in FIG. 17, instead of the recess REC2, a hole H2 penetrating through the first planarization layer 117a and partially exposing the buffer layer 111 may be formed in the first planarization layer 117a in a location corresponding to the second pixel electrode 121'. In addition, the opaque layer SHL may be formed in the hole H2 to fill the hole H2. The hole H2 may be obtained (e.g., may be formed) in a process of forming the contact hole in the first planarization layer 117a at (e.g., in or on) the main display area MDA and the peripheral area DPA. A part of the connecting line TWL may be directly on the opaque layer SHL, and a remaining part of the connecting line TWL may be directly on the first planarization layer 117a. The second planarization layer 117b may cover the connecting line TWL, the opaque layer SHL, and the first planarization layer 117a.

In the embodiments of FIGS. 15 and 17, the connecting line TWL is show as being on the opaque layer SHL, but as shown in FIG. 6B, the connecting line TWL may be in the first hole H1, or in other words, on the buffer layer 111, and may be connected to the connecting electrode CM' on the first planarization layer 117a.

Figure 18:
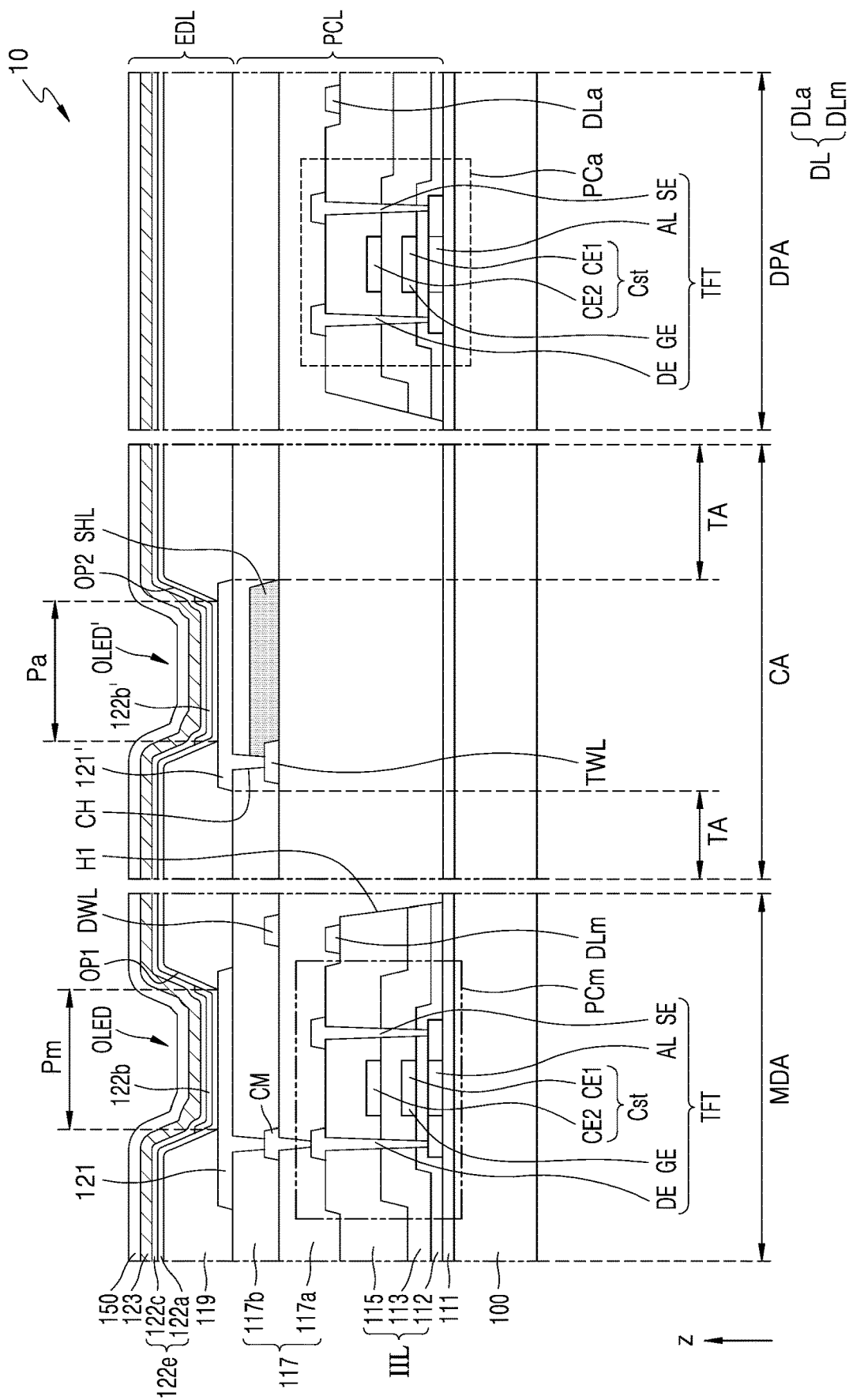
FIG. 18 is a cross-sectional view showing some portions of a display panel according to an embodiment.
Figure 19A:
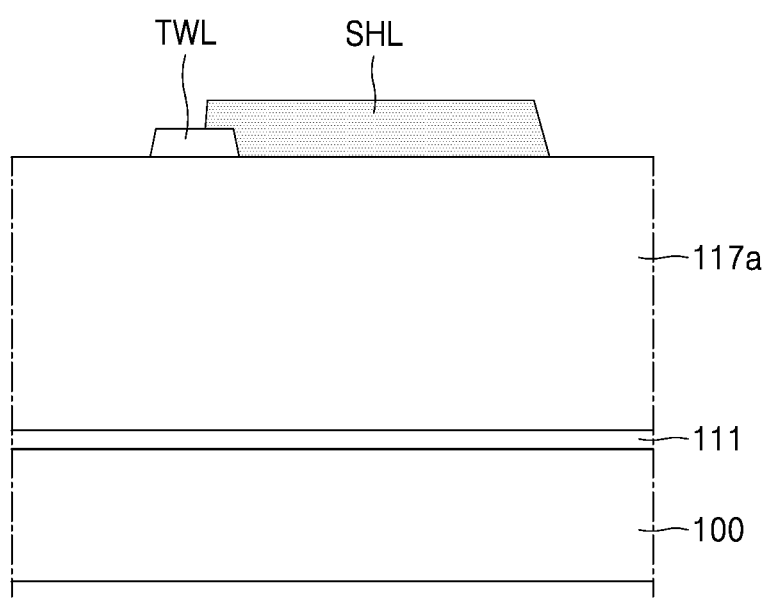
FIGS. 19A-19C are cross-sectional views illustrating various processes of forming the second pixel electrode and the opaque layer according to the embodiment of FIG. 18.
Figure 19B:
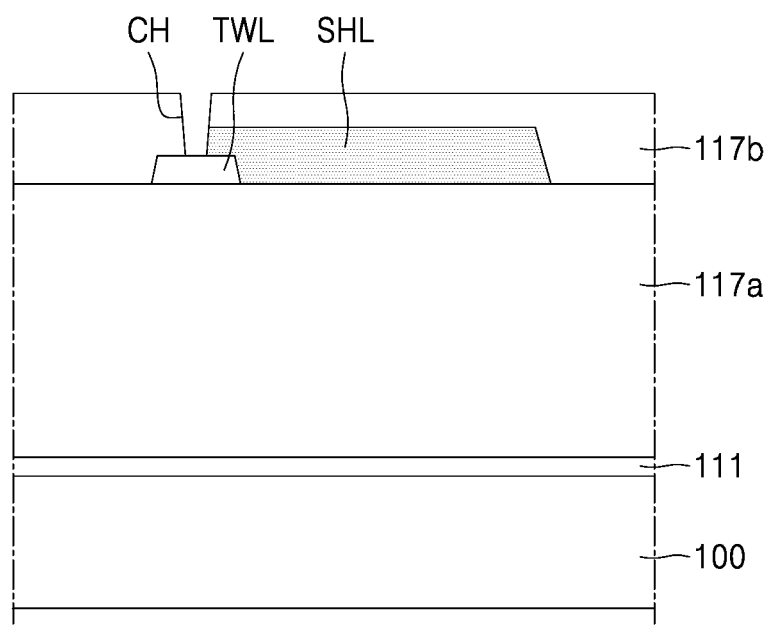
Figure 19C:
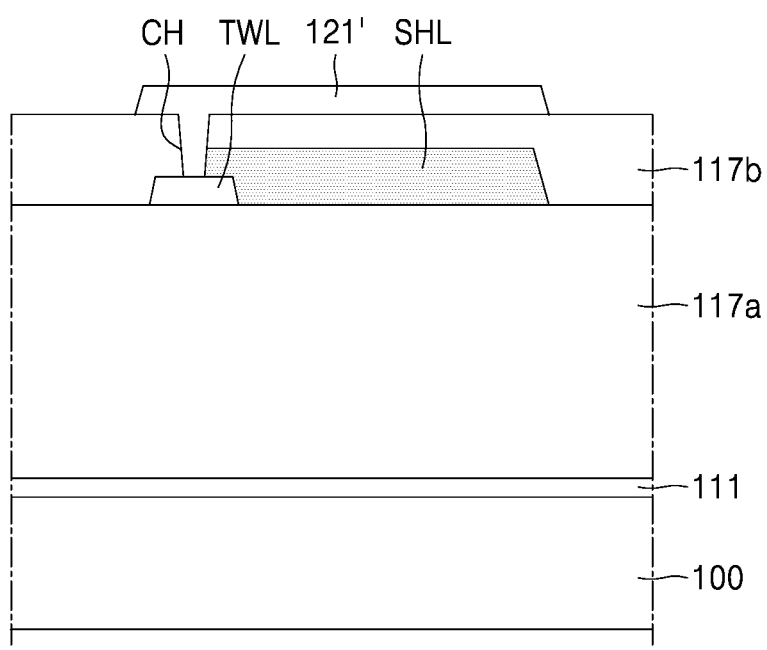
Figure 20:
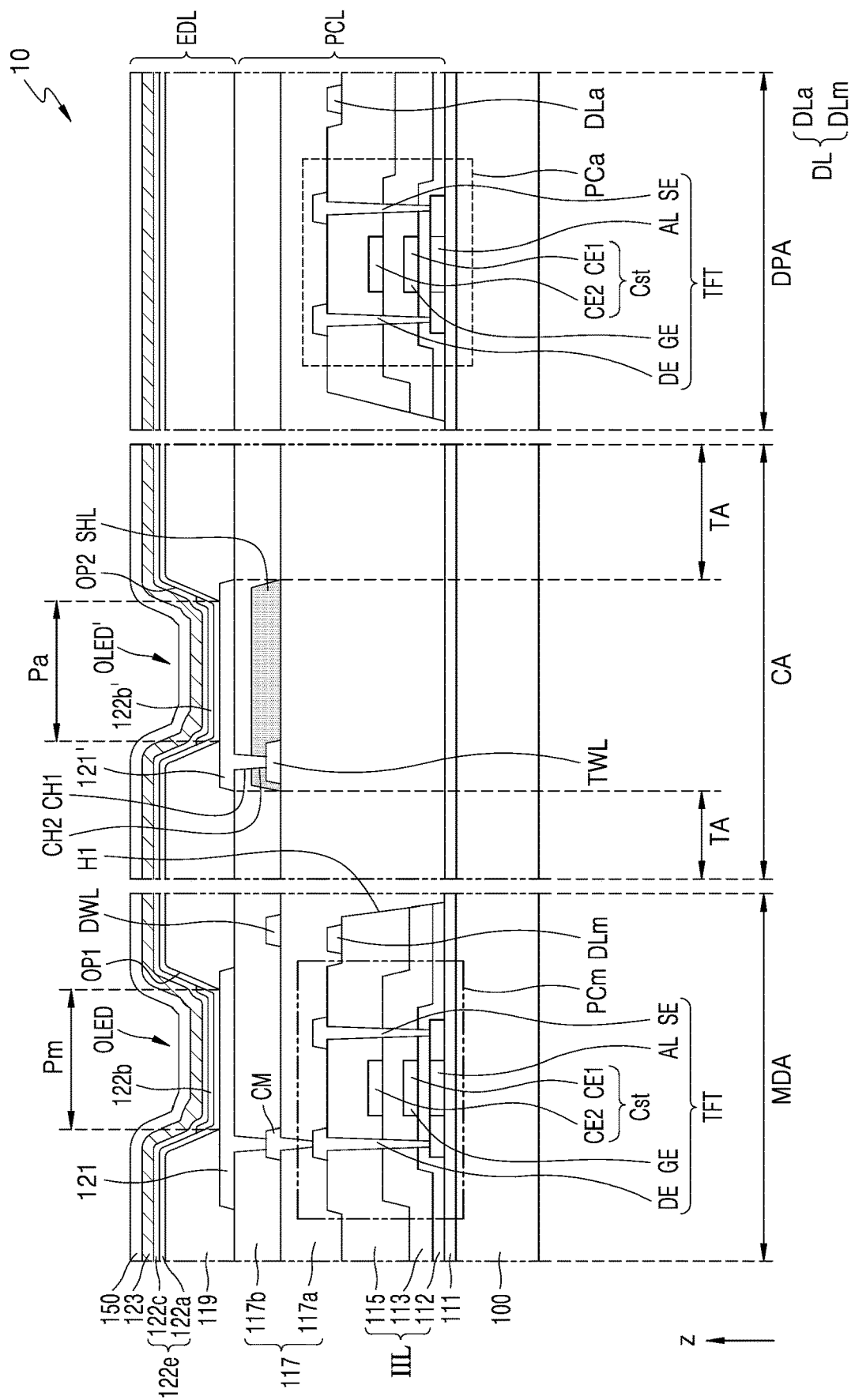
FIG. 20 is a cross-sectional view showing some portions of a display panel according to an embodiment.

FIGS. 18 and 20 are cross-sectional views showing some portions of the display panel 10 according to one or more embodiments. FIGS. 19A to 19C are cross-sectional views illustrating various processes of forming the second pixel electrode 121' and the opaque layer SHL according to the embodiment of FIG. 18. In FIGS. 18 and 20, like reference symbols denote the same or substantially the same members, elements, and layers as those of FIG. 6A, and thus, redundant description thereof may not be repeated.

Referring to FIG. 18, the connecting line TWL and the opaque layer SHL may be on the first planarization layer 117a at (e.g., in or on) the component area CA. The opaque layer SHL may be at a location corresponding to the second pixel electrode 121'. The second planarization layer 117b may be on the connecting line TWL and the opaque layer SHL.

The opaque layer SHL may at least partially cover the connecting line TWL. In other words, a part of the connecting line TWL may be between the first planarization layer 117a and the opaque layer SHL, and another part of the connecting line TWL may be between the first planarization layer 117a and the second planarization layer 117b.

The second pixel electrode 121' may be on the second planarization layer 117b, and may be connected to the connecting line TWL via the contact hole CH.

As shown in FIG. 19A, the first planarization layer 117a may be on the buffer layer 111, and the connecting line TWL may be on the first planarization layer 117a. The opaque layer SHL may be on the first planarization layer 117a to correspond to the second pixel electrode 121'. A part of the opaque layer SHL may cover a part of the connecting line TWL, which overlaps with the second pixel electrode 121'. For example, the opaque layer SHL may cover a part of the connecting line TWL other than a region thereof that is to be exposed through the contact hole CH that will be subsequently formed in the second planarization layer 117b.

As shown in FIG. 19B, the second planarization layer 117b may be on the first planarization layer 117a, while covering the connecting line TWL and the opaque layer SHL. The contact hole CH partially exposing the connecting line TWL may be formed in the second planarization layer 117b. The second planarization layer 117b may further include a contact hole partially exposing the connecting electrode CM at (e.g., in or on) the main display area MDA.

As shown in FIG. 19C, the second pixel electrode 121' is on the second planarization layer 117b, and may be connected to the connecting line TWL via the contact hole CH. The first pixel electrode 121 is also on the second planarization layer 117b, and may be connected to the connecting electrode CM via the contact hole at (e.g., in or on) the main display area MDA.

In the embodiment illustrated with reference to FIG. 18, the size of the opaque layer SHL is less than (e.g., smaller than) that of the second pixel electrode 121', but as shown in FIG. 20, the size of the opaque layer SHL may be equal to or greater than that of the second pixel electrode 121'. In this case, the opaque layer SHL may cover the region of the connecting line TWL overlapping with the second pixel electrode 121'. The second pixel electrode 121' may be connected to the connecting line TWL via the contact hole CH1 in the second planarization layer 117b and the contact hole CH2 in the opaque layer SHL. The contact hole CH1 in the second planarization layer 117b may overlap with the contact hole CH2 in the opaque layer SHL.

In the embodiments of FIGS. 18 and 20, the connecting line TWL is shown as being on the opaque layer SHL, but as shown in FIG. 6B, the connecting line TWL may be in the first hole H1, or in other words, on the buffer layer 111, and may be connected to the connecting electrode CM' on the first planarization layer 117a. In this case, the opaque layer SHL may partially or entirely cover a region of the connecting electrode CM', which overlaps with the second pixel electrode 121'.

Figure 21:
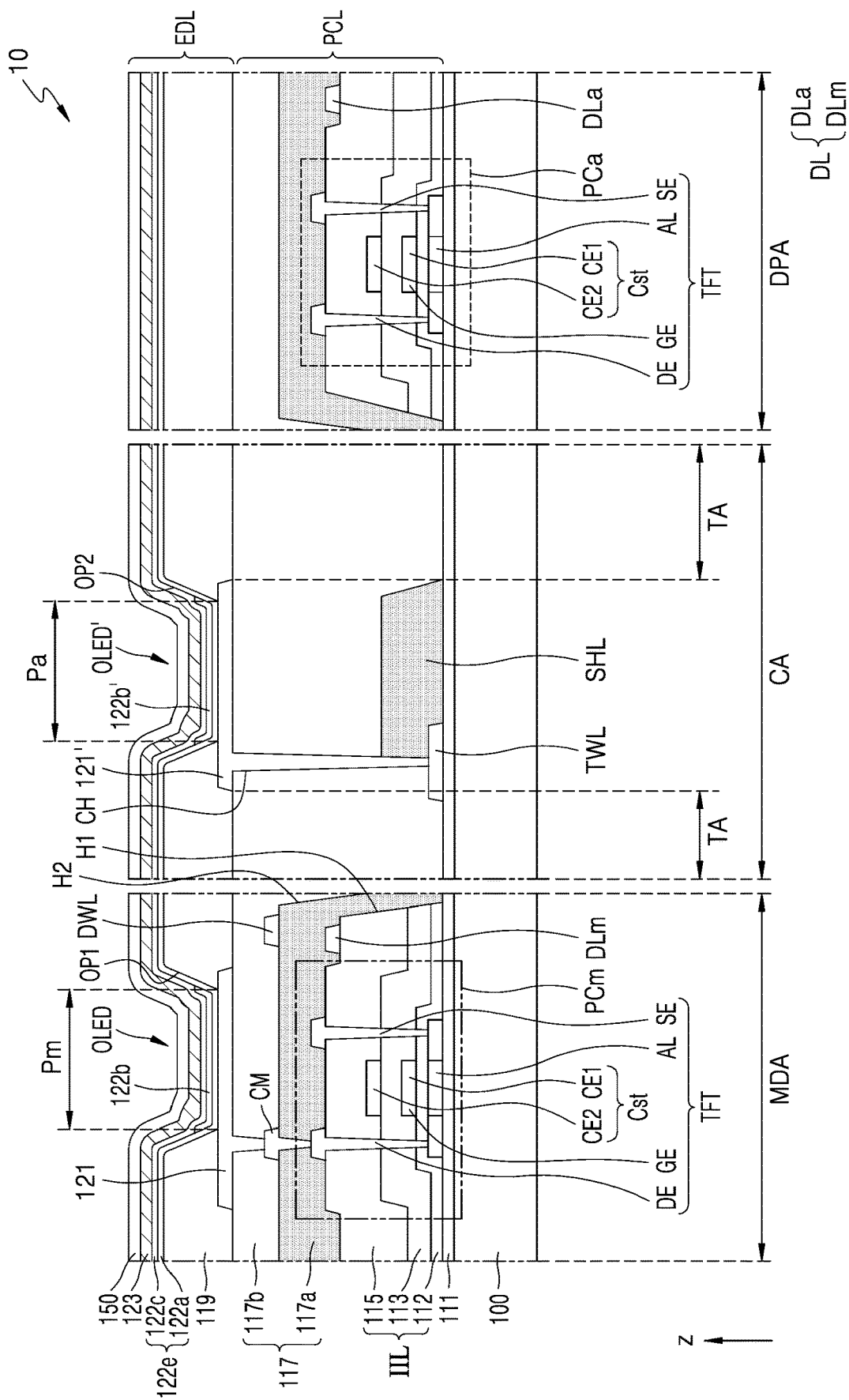
FIGS. 21-22 are cross-sectional views showing some portions of a display panel according to one or more embodiments.
Figure 22:
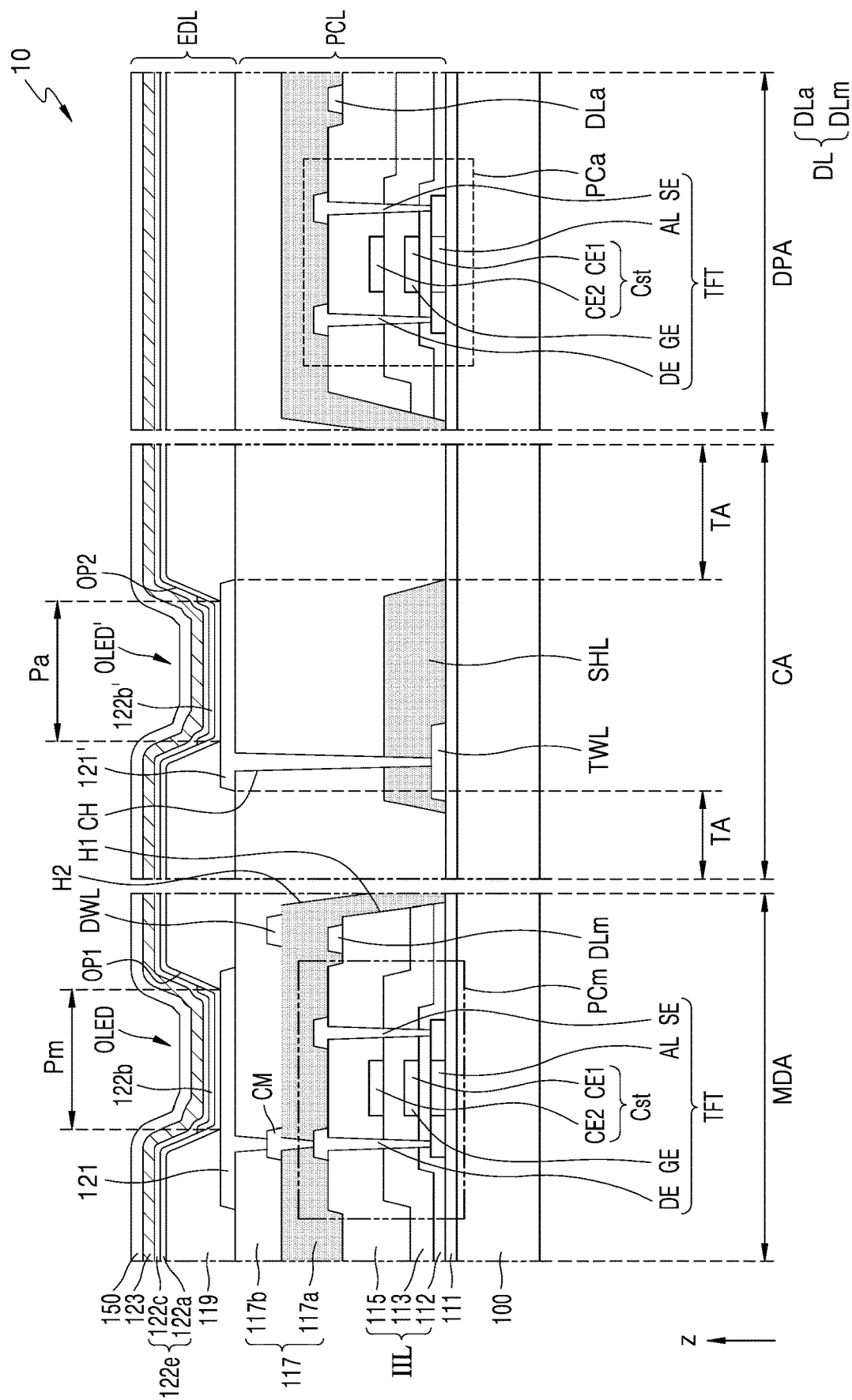

FIGS. 21 and 22 are cross-sectional views showing some portions of a display panel according to one or more embodiments. In FIGS. 21 and 22, like reference symbols denote the same or substantially the same members, elements, and layers as those of FIG. 6A, and thus, redundant description thereof may not be repeated.

In the embodiments illustrated in FIGS. 21 and 22, the first planarization layer 117a includes the second hole H2 corresponding to the component area CA, and the connecting line TWL and the opaque layer SHL are in the second hole H2. Here, the first planarization layer 117a may include the same material as that of the opaque layer SHL.

At (e.g., in or on) the component area CA, the connecting line TWL is on the buffer layer 111, and the opaque layer SHL may be between the buffer layer 111 and the second planarization layer 117b at a location corresponding to the second pixel electrode 121'. After forming the connecting line TWL on the buffer layer 111, the opaque layer SHL may be formed on the connecting line TWL so as to partially or entirely cover the connecting line TWL. The second planarization layer 117b is filled in the second hole H2 of the first planarization layer 117a, and may cover the exposed buffer layer 111, the connecting line TWL, and the opaque layer SHL. In other words, a part of the connecting line TWL may be between the buffer layer 111 and the second planarization layer 117b, and another part of the connecting line TWL may be between the buffer layer 111 and the opaque layer SHL.

The second planarization layer 117b may be on the first planarization layer 117a at (e.g., in or on) the main display area MDA and the peripheral area DPA.

When the second hole H2 is formed in the first planarization layer 117a above the substrate 100, the opaque layer SHL may be obtained (e.g., may be formed) by patterning a remaining part of the first planarization layer 117a in the second hole H2 at (e.g., in or on) the component area CA. According to the present embodiments, a process of forming the opaque layer SHL, which may be a separate process from the process of forming the planarization layer 117, may be omitted.

The connecting line TWL may be connected to the second pixel electrode 121' via the contact hole in the second planarization layer 117b. The connecting line TWL is connected to the additional connecting line TWL' via a contact hole, and may be connected to the second pixel circuit PCa via the additional connecting line TWL'. The opaque layer SHL may partially cover the region of the connecting line TWL overlapping with the second pixel electrode 121' as shown in FIG. 21, or may entirely cover the region of the connecting line TWL overlapping with the second pixel electrode 121' as shown in FIG. 22.

According to one or more embodiments of the present disclosure, the opaque layer SHL is located between the second pixel electrode 121', or in other words, the reflective layer, and the substrate 100 at (e.g., in or on) the component area CA, and thus, there is no reflective layer located between the opaque layer SHL and the substrate 100. The connecting line TWL including the transparent conductive material having a reflectivity of a suitable level (e.g., a predetermined or certain level) or less, and the transparent organic layer/inorganic layer may be (e.g., may only exist) between the opaque layer SHL and the substrate 100. Accordingly, the light reflection due to the reflective layer at (e.g., in or on) the component area CA may be reduced.

As described above, in the display panel and the display apparatus according to one or more embodiments of the present disclosure, the pixel circuits are not located at (e.g., in or on) the component area, and thus, a relatively wider transmission region may be ensured, to thereby improve transmittance thereof. However, the present disclosure is not limited to these aspects and features.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display panel comprising:
    a first area, a second area, and a third area, a resolution of the second area being less than a resolution of the first area;
    a substrate;
    a first pixel electrode at the first area on the substrate;
    a first pixel circuit at the first area on the substrate, the first pixel circuit being connected to the first pixel electrode;
    a second pixel electrode at the second area on the substrate;
    a second pixel circuit at the third area on the substrate, the second pixel circuit being connected to the second pixel electrode; and
    an opaque layer at the second area between the substrate and the second pixel electrode, the opaque layer comprising an insulating pattern overlapping with the second pixel electrode.

2. The display panel of claim 1, further comprising:
    a first organic insulating layer between the substrate and the second pixel electrode at the second area; and
    a second organic insulating layer on the first organic insulating layer.

3. The display panel of claim 2, wherein the opaque layer is between the second organic insulating layer and the second pixel electrode.

4. The display panel of claim 3, wherein an upper surface of the opaque layer contacts the second pixel electrode, and
 a lower surface of the opaque layer contacts the second organic insulating layer.

5. The display panel of claim 3, wherein the second organic insulating layer includes a recess corresponding to the second pixel electrode, and
 the opaque layer is in the recess of the second organic insulating layer.

6. The display panel of claim 2, wherein the opaque layer is between the first organic insulating layer and the second organic insulating layer.

7. The display panel of claim 6, wherein the first organic insulating layer includes a recess corresponding to the second pixel electrode, and
 the opaque layer is in the recess of the first organic insulating layer.

8. The display panel of claim 2, wherein a hole at a location corresponding to the second pixel electrode penetrates through the first organic insulating layer, and
 the opaque layer is in the hole of the first organic insulating layer.

9. The display panel of claim 2, further comprising a first connecting line between the first organic insulating layer and the second organic insulating layer at the second area, the first connecting line connecting the second pixel electrode to the second pixel circuit.

10. The display panel of claim 9, further comprising a second connecting line at the third area, the second connecting line connecting the first connecting line to the second pixel circuit.

11. The display panel of claim 2, further comprising a first connecting line between the substrate and the first organic insulating layer at the second area, the first connecting line connecting the second pixel electrode to the second pixel circuit.

12. The display panel of claim 11, further comprising a second connecting line at the third area, the second connecting line connecting the first connecting line to the second pixel circuit.

13. The display panel of claim 1, further comprising:
 a first organic insulating layer covering the first pixel circuit at the first area and the second pixel circuit at the third area, the first organic insulating layer including a hole corresponding to the second area; and
 a second organic insulating layer on the first organic insulating layer at the first area and the third area, the second organic insulating layer filling the hole of the first organic insulating layer at the second area between the substrate and the second pixel electrode.

14. The display panel of claim 13, wherein the opaque layer is between the substrate and the second organic insulating layer at the second area.

15. The display panel of claim 14, further comprising a first connecting line between the substrate and the second organic insulating layer at the second area, the first connecting line connecting the second pixel electrode to the second pixel circuit,
 wherein the opaque layer at least partially covers the first connecting line.

16. The display panel of claim 15, further comprising a second connecting line at the third area, the second connecting line connecting the first connecting line to the second pixel circuit.

* * * * *